(12) United States Patent
Watanabe

(10) Patent No.: US 12,132,449 B2
(45) Date of Patent: Oct. 29, 2024

(54) AMPLIFICATION CIRCUIT

(71) Applicant: Murata Manufacturing Co., Ltd., Kyoto (JP)

(72) Inventor: Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/932,395

(22) Filed: Sep. 15, 2022

(65) Prior Publication Data
US 2023/0006609 A1 Jan. 5, 2023

Related U.S. Application Data

(63) Continuation of application No. 17/325,350, filed on May 20, 2021, which is a continuation of application
(Continued)

(30) Foreign Application Priority Data

Mar. 30, 2018 (JP) .................................. 2018-069489

(51) Int. Cl.
*H03F 3/04* (2006.01)
*H03F 1/02* (2006.01)
(Continued)

(52) U.S. Cl.
CPC ............. *H03F 1/22* (2013.01); *H03F 1/0205* (2013.01); *H03F 3/193* (2013.01); *H03F 3/245* (2013.01)

(58) Field of Classification Search
CPC .......... H03F 1/22; H03F 1/0205; H03F 3/193; H03F 3/245; H03F 1/086; H03F 3/72;
(Continued)

(56) References Cited

U.S. PATENT DOCUMENTS 4,250,463 A * 2/1981 Foster ....................... H03F 3/19
330/311
6,396,347 B1 * 5/2002 Lie ....................... H03G 1/0088
330/285
(Continued)

FOREIGN PATENT DOCUMENTS

CN 104362987 A * 2/2015 ........... H03F 1/0205
JP 855-047485 B 3/1980
(Continued)

OTHER PUBLICATIONS

Korean Office action for 10-2019-0034921 dated Aug. 27, 2020 cited in the U.S. Appl. No. 16/367,750.
(Continued)

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

An amplification circuit includes: a power supply terminal that is connected to a power supply; a transistor that has a source terminal, a drain terminal, and a gate terminal to which a high-frequency signal is input; a transistor that has a source terminal that is connected to the drain terminal, a drain terminal that outputs a high-frequency signal, and a gate terminal that is grounded; a capacitor that is serially disposed on a second path that connects the gate terminal and the power supply terminal to each other; and a switch that is serially disposed on a first path or the second path. The drain terminal and the gate terminal are connected to each other via the switch and the capacitor.

15 Claims, 17 Drawing Sheets

Related U.S. Application Data

No. 16/367,750, filed on Mar. 28, 2019, now Pat. No. 11,043,922.

(51) Int. Cl.
*H03F 1/22* (2006.01)
*H03F 3/193* (2006.01)
*H03F 3/24* (2006.01)

(58) Field of Classification Search
CPC ...... H03F 2200/451; H03F 1/223; H03F 3/19; H03F 1/565
USPC .................................. 330/51, 296, 285, 283
See application file for complete search history.

(56) References Cited

U.S. PATENT DOCUMENTS

| | | | |
|---|---|---|---|
| 6,400,227 | B1 | 6/2002 | Goldfarb et al. |
| 7,646,252 | B2 | 1/2010 | Banba |
| 9,583,409 | B2* | 2/2017 | Yokoyama ............ H01L 23/562 |
| 11,043,922 | B2* | 6/2021 | Watanabe ................ H03F 3/193 |
| 2001/0009390 | A1* | 7/2001 | Kusachi .................. H03F 1/226 |
| | | | 330/311 |
| 2007/0296507 | A1 | 12/2007 | Hamaguchi |
| 2008/0297259 | A1 | 12/2008 | Mu |
| 2010/0226450 | A1 | 9/2010 | Tanaka |
| 2013/0128779 | A1 | 5/2013 | Murakami |
| 2014/0159766 | A1* | 6/2014 | Fujita .................. G01R 31/2822 |
| | | | 324/762.01 |
| 2015/0070095 | A1 | 3/2015 | Cabanillas et al. |
| 2015/0207475 | A1 | 7/2015 | Roy et al. |
| 2016/0164469 | A1* | 6/2016 | Nobbe .................. H03F 1/0216 |
| | | | 330/296 |
| 2018/0351514 | A1 | 12/2018 | Oon et al. |

FOREIGN PATENT DOCUMENTS

| | | |
|---|---|---|
| JP | H03-113904 A | 5/1991 |
| JP | 2008-5160 A | 1/2008 |
| JP | 2008-178085 A | 7/2008 |
| JP | 2010-528545 A | 8/2010 |
| JP | 2012-99915 A | 5/2012 |
| JP | 2013-110588 A | 6/2013 |
| JP | 2016-530845 A | 9/2016 |
| WO | 2009/044643 A1 | 4/2009 |

OTHER PUBLICATIONS

Japanese Office action for 2018-069489 dated Sep. 8, 2020 cited in the U.S. Appl. No. 16/367,750.

* cited by examiner

AMPLIFICATION CIRCUIT

This is a continuation-in-part of U.S. patent application Ser. No. 17/325,350 filed on May 20, 2021, which is a continuation of Ser. No. 16/367,750 filed on Mar. 28, 2019, now issued as U.S. Pat. No. 11,043,922, which claims priority from Japanese Patent Application No. 2018-069489 filed on Mar. 30, 2018. The contents of these applications are incorporated herein by reference in its entirety.

BACKGROUND OF THE DISCLOSURE

1. Field of the Disclosure

The present disclosure relates to a cascode-connection amplification circuit.

2. Description of the Related Art

A cascode-connection amplification circuit is often used as a high-frequency signal amplification circuit.

Japanese Unexamined Patent Application Publication No. 2008-5160 discloses a cascode-connection amplification circuit that includes a first transistor and a second transistor. More specifically, the first transistor has a common emitter (or common source) and the second transistor has a common base (gate). In addition, whether or not a collector (drain) terminal of the first transistor is grounded can be switched using a switch.

However, in the cascode-connection amplification circuit disclosed in Japanese Unexamined Patent Application Publication No. 2008-5160, a parasitic inductance caused by a ground wiring line is added to the second transistor, which has a common base (gate), and as a result the grounding characteristic of the second transistor becomes unstable and the stability factor (K factor) of the cascode-connection amplification circuit is reduced. In this state, there is a risk that the amplification circuit will undergo oscillation when feedback occurs via a parasitic capacitance or the like in the vicinity of the transistor.

BRIEF SUMMARY OF THE DISCLOSURE

Accordingly, the present disclosure was made in order to solve the above-described problem and it is an object thereof to provide a stable cascode-connection amplification circuit in which oscillation is prevented.

In order to achieve this object, an amplification circuit according to a preferred embodiment of the present disclosure includes: a first input terminal to which a high-frequency signal is input; an output terminal that outputs the high-frequency signal, which has been amplified; a power supply terminal that is connected to a power supply that generates a direct-current power supply voltage; a first transistor that has a first terminal, a second terminal, and a first control terminal to which a high-frequency signal is input via the first input terminal; a second transistor that has a third terminal that is connected to the second terminal, a fourth terminal that outputs an amplified high-frequency signal, and a second control terminal that is grounded, the second transistor being cascode connected to the first transistor; a first capacitance element that is serially disposed on a second path that connects the second control terminal and the power supply terminal to each other; and a first resistive element that is serially arranged on a first path that connects the fourth terminal and the power supply terminal to each other or is serially arranged on the second path, and that is a first resistance element or a first switch element; the fourth terminal and the second control terminal being connected to each other via the first resistive element and the first capacitance element.

Although the second control terminal of the second transistor is grounded, a parasitic inductance component is generated at the second control terminal due to for example a wiring line that is for grounding the second control terminal. Therefore, in the amplification circuit of the related art, the stability of the second transistor is reduced due to the potential of the second control terminal not being grounded in a fixed manner, feedback occurs, and an oscillation undesirably occurs when a loop formed by this feedback has a loop gain greater than or equal to 1.

With respect to this, in the above-described configuration, since the fourth terminal, which is an output terminal for a high-frequency signal, and the second control terminal are connected to each other via the first resistive element, a loop can be formed that does not have a loop gain greater than or equal to 1 due to the loop gain being reduced by the first resistive element. In addition, the potential of the second control terminal is isolated from the power supply potential by the first capacitance element disposed on the second path. Thus, even when a parasitic inductance component is generated at the second control terminal, the high-frequency feedback signal is attenuated, and therefore a stable amplification circuit in which oscillation is prevented can be provided.

In addition, the amplification circuit may further include: a first inductance element that is serially disposed on the first path that connects the fourth terminal and the power supply terminal; and a second capacitance element that is serially disposed between the fourth terminal and the output terminal; and the first resistive element may be serially disposed on the first path or the second path between the first inductance element and the second control terminal.

Due to this configuration, the first resistive element is disposed in a region outside the first transistor, the second transistor, and a matching network formed by the first inductance element and the second capacitance element, and therefore degradation of the gain of the amplifier formed by the first transistor and the second transistor can be suppressed.

In addition, the first resistive element may be the first resistance element and the first resistance element may be serially disposed on just the second path out of the first path and the second path.

Due to this configuration, a current of the second transistor that flows along the first path is not attenuated by the first resistive element, and therefore degradation of the amplification characteristics can be avoided.

Furthermore, the first resistive element may be the first switch element, and the first switch element may be serially disposed on the first path that connects the fourth terminal and the power supply terminal to each other.

Due to this configuration, a so-called off leakage current that flows from the power supply terminal to the ground terminal via the fourth terminal, the third terminal, the second terminal, and the first terminal can be suppressed by putting the first switch element into a non-conductive state when the first transistor and the second transistor are not operating.

In addition, when the amplification circuit is performing an amplification operation, the first switch element may be in a conductive state, and when the amplification circuit is not performing an amplification operation, the first switch element may be in a non-conductive state.

Due to this configuration, when the amplification circuit is performing an amplification operation, oscillation of the amplification circuit can be suppressed, and when the amplification circuit is not performing an amplification operation, the off leakage current of the amplification circuit can be suppressed.

The amplification circuit may further include: a second resistive element that is serially disposed on the first path or the second path, and is a second resistance element or a second switch element.

Due to this configuration, even in the case where the necessary resistance value is not secured using just the on resistance of the first switch element when the first switch element is in a conductive state, sufficient loop attenuation can be realized using the second resistive element.

In addition, the amplification circuit may further include a third resistance element that is connected in parallel with the first inductance element.

Due to this configuration, even in the case where the necessary resistance value is not secured using just the on resistance of the first switch element, sufficient loop attenuation can be realized using the third resistance element.

The amplification circuit may further include a third capacitance element and a first series circuit in which a fourth capacitance element and a third switch element are connected in series with each other. The third capacitance element and the first series circuit may be each connected in parallel with the first inductance element.

Thus, the parallel resonant frequency of a parallel resonance circuit consisting of the first inductance element and the third capacitance element can be varied by switching the third switch element between a conductive state and a non-conductive state. Therefore, the frequency can be adjusted over a wide range of frequencies to achieve a high gain.

The amplification circuit may further include a second series circuit in which a fifth capacitance element and a fourth switch element are connected in series with each other. The second series circuit may be connected in parallel with the second capacitance element.

Thus, by switching the fourth switch element to either a conductive state or a non-conductive state, it is possible to adjust the frequency and impedance at which impedance matching with an externally connected circuit connected to the output terminal is to be realized over a wide range of frequencies.

The amplification circuit may further include: a plurality of filters that are connected between the first input terminal and the first control terminal and have different frequency bands as pass bands thereof; a first switch circuit that is connected between the first input terminal and the plurality of filters and is configured so as to be capable of switching a connection between the first input terminal and any of the plurality of filters; and a second switch circuit that is connected between the plurality of filters and the first control terminal and is configured so as to be capable of switching a connection between the first control terminal and any of the plurality of filters.

With this configuration, a plurality of filters are disposed, and as a result, the frequencies at which the amplification circuit has gain can be restricted and unwanted waves can be suppressed. The conditions under which a signal source impedance can be obtained at particular frequencies as seen from the second transistor are broadened by switching the plurality of filters, resulting in an increased risk of the amplification circuit oscillating at a particular frequency, but a high-frequency feedback signal can be attenuated by the first resistive element and the first capacitance element even if a parasitic inductance component is generated at the second control terminal, and a stable amplification circuit in which oscillation is prevented can be provided.

The amplification circuit may further include a ground terminal to which the second control terminal is connected and an IC substrate on or in which the ground terminal, the first transistor, the second transistor, the first capacitance element, and the first resistive element are disposed. The ground terminal may be a bump electrode bonded to a main surface of the IC substrate.

With this configuration, a high-frequency feedback signal is attenuated by the first resistive element and the first capacitance element even when a parasitic inductance component is generated at the second control terminal, and a stable amplification circuit in which oscillation is prevented can be provided.

The amplification circuit may further include an external connection terminal to which the second control terminal is connected, an IC substrate on or in which the first transistor, the second transistor, the first capacitance element, and the first resistive element are disposed, and a module substrate having a first main surface and a second main surface, which face each other, the IC substrate being disposed on the first main surface. The external connection terminal may be disposed on the second main surface of the module substrate.

With this configuration, a high-frequency feedback signal is attenuated by the first resistive element and the first capacitance element even when a parasitic inductance component is generated at the second control terminal, and a stable amplification circuit in which oscillation is prevented can be provided.

The amplification circuit may further include a first inductance element that is serially disposed on the first path that connects the fourth terminal and the power supply terminal to each other, and a second capacitance element that is serially disposed between the fourth terminal and the output terminal. The first inductance element may be serially arranged on the first path or the second path between the first resistive element and the second control terminal.

The amplification circuit may further include a second input terminal, a third transistor that has a fifth terminal, a sixth terminal, and a third control terminal to which a high-frequency signal is input via the second input terminal, and a fourth transistor that has a seventh terminal that is connected to the fifth terminal, an eighth terminal that outputs an amplified high-frequency signal, and a fourth control terminal that is grounded, the fourth transistor being cascode connected to the third transistor. The first resistive element may be the first switch element serially disposed between the first inductance element and the fourth terminal. The first path may connect the fourth terminal and the power supply terminal to each other and connect the eighth terminal and the power supply terminal to each other. The second path may connect the second control terminal and the power supply terminal to each other and connect the fourth control terminal and the power supply terminal to each other. The amplification circuit further may further include a third switch element serially disposed between the first inductance element and the eighth terminal.

With this configuration, since the fourth terminal, which is an output terminal for a high-frequency signal, and the second control terminal are connected to each other via the first resistive element, a loop can be formed that does not have a loop gain greater than or equal to 1 due to the loop gain being reduced by the first resistive element. In addition, the potential of the second control terminal is isolated from the power supply potential by the first capacitance element disposed on the second path. Thus, even when a parasitic inductance component is generated at the second control terminal, the high-frequency feedback signal is attenuated, and therefore a stable amplification circuit in which oscillation is prevented can be provided.

An amplification circuit according to a preferred embodiment of the present disclosure includes: an input terminal to which a high-frequency signal is input; an output terminal that outputs the high-frequency signal, which has been amplified; a power supply terminal that is connected to a power supply that generates a direct-current power supply voltage; a first transistor that has a first terminal, a second terminal, and a first control terminal to which a high-frequency signal is input; a second transistor that has a third terminal that is connected to the second terminal, a fourth terminal that outputs an amplified high-frequency signal, and a second control terminal, the second transistor being cascode connected to the first transistor; and a first resistive element that is serially disposed on a first path that connects the fourth terminal and the power supply terminal to each other, and that is a first resistance element or a first switch element. The fourth terminal and the second control terminal are connected to each other via the first resistive element.

In the case where the second control terminal of the second transistor is set to the direct-current power supply voltage of the power supply, a parasitic inductance component is generated at the second control terminal of the second transistor due to for example a wiring line that is for connecting the power supply terminal and the power supply to each other. Therefore, the potential of the second control terminal becomes unstable with respect to high frequencies, feedback occurs, and oscillation undesirably occurs when a loop formed by the feedback has a loop gain greater than or equal to 1.

With respect to this, in the above-described configuration, since the fourth terminal, which is an output terminal for a high-frequency signal, and the second control terminal are connected to each other via the first resistive element, a loop can be formed that does not have a loop gain greater than or equal to 1 due to the loop gain being reduced by the first resistive element. In addition, the second control terminal is fixed at the direct-current power supply voltage. Due to this configuration, a high-frequency feedback signal is attenuated, and therefore a stable amplification circuit in which oscillation is prevented can be provided.

In addition, the amplification circuit may further include a first inductance element that is serially disposed on the first path that connects the fourth terminal and the power supply terminal and a second capacitance element that is serially disposed between the fourth terminal and the output terminal. The first resistive element may be serially disposed on the first path between the first inductance element and the power supply terminal.

Due to this configuration, the first resistive element is disposed in a region outside the first transistor, the second transistor, and a matching network formed by the first inductance element and the second capacitance element, and therefore degradation of the gain of the amplifier formed by the first transistor and the second transistor can be suppressed.

Furthermore, the first resistive element may be the first switch element, and the first switch element may be serially disposed on the first path that connects the fourth terminal and the power supply terminal to each other.

Due to this configuration, a so-called off leakage current that flows from the power supply terminal to the ground terminal via the fourth terminal, the third terminal, the second terminal, and the first terminal can be suppressed by putting the first switch element into a non-conductive state when the first transistor and the second transistor are not operating.

In addition, when the amplification circuit is performing an amplification operation, the first switch element may be in a conductive state, and when the amplification circuit is not performing an amplification operation, the first switch element may be in a non-conductive state.

Due to this configuration, when the amplification circuit is performing an amplification operation, oscillation of the amplification circuit can be suppressed, and when the amplification circuit is not performing an amplification operation, the off leakage current of the amplification circuit can be suppressed.

In addition, the amplification circuit may further include a second resistive element that is serially disposed on only a second path, which connects the second control terminal and the power supply terminal, among the first path and the second path and that is a second resistance element or a second switch element.

Due to this configuration, even in the case where the necessary resistance value is not secured using only the on resistance of the switch element when the switch element is in a conductive state, sufficient loop attenuation can be realized using the second resistance element while fixing the potential of the second control terminal.

In addition, the amplification circuit may further include a third resistance element that is connected in parallel with the first inductance element.

Due to this configuration, even in the case where the necessary resistance value is not secured using just the on resistance of the first switch element, sufficient loop attenuation can be realized using the third resistance element.

According to the present disclosure, a stable cascode-connection amplification circuit in which oscillation is prevented can be provided.

BRIEF DESCRIPTION OF THE SEVERAL
VIEWS OF THE DRAWINGS

DETAILED DESCRIPTION OF THE DISCLOSURE

Figure 1:
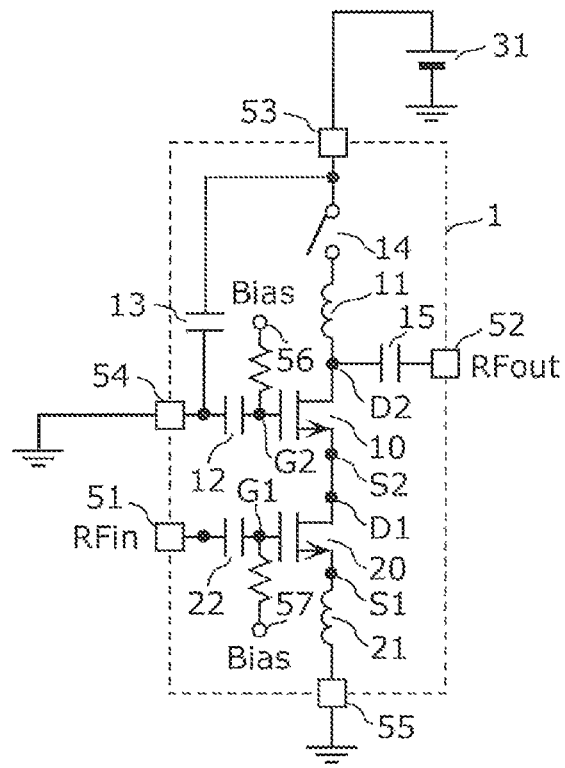
FIG. 1 is a circuit configuration diagram of an amplification circuit according to Embodiment 1 and circuits peripheral to the amplification circuit.

Hereafter, embodiments of the present disclosure will be described in detail using embodiments and the drawings. The embodiments described hereafter each illustrate a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. In addition, the sizes or size ratios between the constituent elements illustrated in the drawings are not necessarily strictly accurate.

Embodiment 1

1.1 Configuration of Amplification Circuit

FIG. 1 is a circuit configuration diagram of an amplification circuit 1 according to Embodiment 1 and circuits peripheral to the amplification circuit 1. As illustrated in the figure, the amplification circuit 1 includes an input terminal 51, an output terminal 52, a power supply terminal 53, ground terminals 54 and 55, transistors 10 and 20, inductors 11 and 21, capacitors 13 and 15, and a switch 14.

The power supply terminal 53 is connected to a power supply 31 that generates a direct-current power supply voltage. In addition, the ground terminals 54 and 55 are grounded. A high-frequency signal (RFin) is input to the input terminal 51 (example of first input terminal) and a high-frequency signal (RFout) amplified by the transistors 10 and 20 is output from the output terminal 52. As illustrated in the figure, the power supply 31 is not an essential constituent element of the amplification circuit 1 and does not need to be included inside the amplification circuit 1.

The transistor 20 is a first transistor that has a source terminal S1 (first terminal), a drain terminal D1 (second terminal), and a gate terminal G1 (first control terminal), and is for example an n-type field effect transistor.

The transistor 10 is a second transistor that has a source terminal S2 (third terminal), a drain terminal D2 (fourth terminal), and a gate terminal G2 (second control terminal), and is for example an n-type field effect transistor.

The transistors 10 and 20 may instead be p-type field effect transistors, or for example may be bipolar transistors. In the case where the transistors 10 and 20 are bipolar transistors, for example, the source terminals will be emitter terminals, the drain terminals will be collector terminals, and the gate terminals will be base terminals.

In the amplification circuit 1 according to this embodiment, the drain terminal D1 is connected to the source terminal S2, the source terminal S1 is connected to the ground terminal 55 via the inductor 21, and the gate terminal G1 is connected to the input terminal 51 via a capacitor 22. In addition, the drain terminal D2 is connected to the output terminal 52 via the capacitor 15, and the gate terminal G2 is connected to the ground terminal 54 via the capacitor 12. In other words, the transistor 10 is cascode connected to the transistor 20, and the amplification circuit 1 forms a cascode-connection amplification circuit.

The inductor 11 is a first inductance element that is serially disposed on a first path that connects the drain terminal D2 and the power supply terminal 53, and is a matching element for realizing impedance matching between the transistors 10 and 20 and an externally connected circuit. The inductor 21 is a second inductance element that is serially disposed on a path that connects the source terminal S1 and the ground terminal 55, and is a source degeneration inductor. The inductors 11 and 21 are not essential constituent elements of the amplification circuit 1 according to this embodiment.

The capacitor 15 is a second capacitance element that is serially disposed between the drain terminal D2 and the output terminal 52. The capacitor 15 is a DC cutting element for removing a direct-current bias component of a high-frequency signal amplified by the transistors 10 and 20, and is also a matching element for realizing impedance matching between the transistors 10 and 20 and an externally connected circuit.

The capacitor 13 is a first capacitance element that is serially disposed on a second path that connects the gate terminal G2 and the power supply terminal 53 to each other. The capacitor 13 functions as a pass capacitor for selectively allowing a high-frequency signal to pass along the second path, and also has a DC cutting function for preventing an unwanted current from flowing along the second path when a direct-current power supply voltage of the power supply 31 is applied to the ground terminal 54 via the power supply terminal 53.

The switch 14 is a switch element that is serially disposed on the first path that connects the drain terminal D2 and the power supply terminal 53 to each other and is a so-called first resistive element that functions as a resistance element having an on resistance when in a conductive state.

In other words, according to the above connection configuration, the drain terminal D2 and the gate terminal G2 are connected to each other via the inductor 11, the switch 14, and the capacitor 13.

According to the above-described configuration of the amplification circuit 1 according to this embodiment, the gate terminal G2 of the transistor 10 is grounded (in a high-frequency manner via the capacitor 12). At this time, a parasitic inductance component, which is for example caused by a wiring line used to (high-frequency) ground the gate terminal G2, is generated at the gate terminal G2.

Therefore, in the amplification circuit of the related art, a problem occurs in that the stability of the transistor is reduced due to the potential of the gate terminal not being (high-frequency) grounded in a fixed manner due to this parasitic inductance component, feedback occurs due to for example a parasitic capacitance generated between the drain terminal D2 and the gate terminal G2 and between the gate terminal G2 and the drain terminal D1, and an oscillation undesirably occurs when a loop formed by the feedback has loop gain that is greater than or equal to 1.

With respect to this, in the above-described configuration of the amplification circuit 1 according to this embodiment, the drain terminal D2 connected to the output terminal 52 and the grounded gate terminal G2 are (high-frequency) connected to each other via the switch 14. Therefore, when the switch 14 is in a conductive state, the drain terminal D2, the inductor 11, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the on resistance. In other words, a high-frequency signal output from the drain terminal D2 is returned via the loop in an attenuated state without passing through a parasitic capacitance or the like generated in the vicinity of the transistor 10. In addition, the potential of the ground terminal 54 is isolated from the power supply potential by the capacitor 13 disposed on the second path. Thus, even when a parasitic inductance component is generated at the gate terminal G2, feedback signals in both directions between the drain terminal D2 and the gate terminal G2 are attenuated by this loop, and therefore a stable amplification circuit 1 in which oscillation is prevented can be provided.

In the case where the amplification circuit 1 is not performing an amplification operation, the switch 14 is in a non-conductive state, and therefore a so-called off leakage current of the transistors 10 and 20 that flows from the power supply terminal 53 to the ground terminal 55 via the drain terminal D2, the source terminal S2, the drain terminal D1, and the source terminal S1 can be suppressed. From this point of view, it is preferable that the switch 14 be disposed on the first path out of the first path and the second path. However, from the viewpoint of the feedback circuit being able to form a loop that does not have a loop gain greater than or equal to 1 (feedback signal is attenuated) due to the on resistance of the switch 14, the switch 14 may be disposed on the second path that connects the gate terminal G2, the capacitor 13, and the power supply terminal 53 to each other.

In addition, the switch 14 may be a first resistance element (resistive element) rather than a switch element that switches between a conductive state and a non-conductive state. However, in this case, the effect of being able to suppress the off leakage current using the first resistance element is low, and therefore the first resistance element may be disposed on the first path or the second path.

The amplification circuit 1 according to this embodiment further includes a bias terminal 57 that is connected to the gate terminal G1, a bias terminal 56 that is connected to the gate terminal G2, the capacitor 22 that is serially disposed between the gate terminal G1 and the input terminal 51, and the capacitor 12 that is serially disposed between the gate terminal G2 and the ground terminal 54.

A bias circuit is connected to the bias terminal 57. The bias circuit generates a direct-current bias voltage or direct-current bias current for setting the operation point of the transistor 20. A bias circuit is connected to the bias terminal 56. The bias circuit generates a direct-current bias voltage or direct-current bias current for setting the operation point of the transistor 10. In this way, the transistors 10 and 20 can be set to optimum operation points. The DC cut capacitor 22 is disposed such that a direct-current bias component is not allowed to leak to the input terminal 51 in the case where a direct-current bias component is applied to the gate terminal G1. The DC cut capacitor 12 is disposed such that a direct-current bias component is not allowed to leak to the ground terminal 54 in the case where a direct-current bias component is applied to the gate terminal G2.

The inductor 11 is a matching element that is for realizing impedance matching between the transistors 10 and 20 and an externally connected circuit, and therefore the inductor 11 is disposed outside the region in which the transistors 10 and 20 are formed. Thus, the resistive element is disposed in a region outside the transistors 10 and 20 and a matching network formed by the inductor 11 and the capacitor 15, and therefore does not affect the gain of an amplifier formed by the transistors 10 and 20.

The first resistive element may be a first resistance element and the first resistance element may be serially disposed on just the second path out of the first path and the second path. As a result, the voltage of the transistor 10 is not reduced by a current flowing through the first resistive element, and therefore degradation of the amplification characteristics can be suppressed.

Figure 2A:
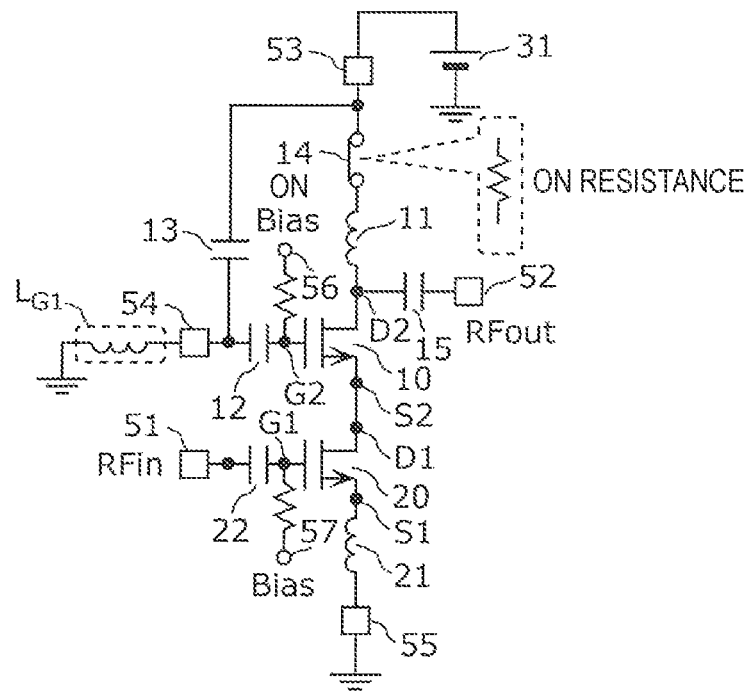
FIG. 2A is a diagram illustrating a circuit state when the amplification circuit according to Embodiment 1 is operating.
Figure 2B:
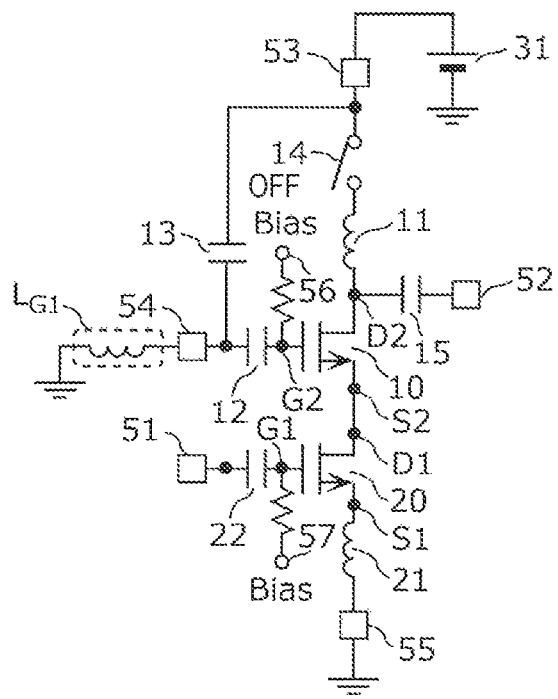
FIG. 2B is a diagram illustrating a circuit state when the amplification circuit according to Embodiment 1 is not operating.

FIG. 2A is a diagram illustrating a circuit state when the amplification circuit 1 according to Embodiment 1 is operating. FIG. 2B is a diagram illustrating a circuit state when the amplification circuit 1 according to Embodiment 1 is not operating. As illustrated in FIGS. 2A and 2B, the switch 14 is serially disposed on the first path that connects the drain terminal D2 and the power supply terminal 53 to each other. In addition, a parasitic inductance $L_{G1}$ is generated at the gate terminal G2 due to a wiring line or the like for (high-frequency) grounding the gate terminal G2.

With respect to this, as illustrated in FIG. 2A, when a high-frequency signal (RFin) is input and the amplification circuit 1 performs an amplification operation, the switch 14 is a conductive state. On the other hand, as illustrated in FIG. 2B, when the amplification circuit 1 is not performing an amplification operation, the switch 14 is in a non-conductive state.

When an amplification operation is performed, the switch 14 has an on resistance when in a conductive state, and therefore the feedback circuit forms a loop that does not have a loop gain that is greater than or equal to 1 (feedback signal is attenuated) due to the on resistance. Thus, even when the parasitic inductance $L_{G1}$ is generated at the gate terminal G2, a high-frequency feedback signal between the drain terminal D2 and the gate terminal G2 is attenuated by this loop, and therefore a stable amplification circuit 1 in which oscillation is prevented can be provided.

On the other hand, when an amplification operation is not being performed, the switch 14 is in a non-conductive state and a so-called off leakage current that flows from the power supply terminal 53 to the ground terminal 55 via the drain terminal D2, the source terminal S2, the drain terminal D1, and the source terminal S1 can be suppressed In other words, in the amplification circuit 1 in which the switch 14 is serially disposed on the first path, oscillation can be suppressed in the amplification circuit 1 when the amplification circuit 1 is performing an amplification operation and the off leakage current of the amplification circuit 1 can be suppressed when the amplification circuit 1 is not performing an amplification operation.

In particular, as the frequency becomes higher, the impedance ($j\omega L_{G1}$) of the parasitic inductance $L_{G1}$ increases and the grounding characteristic of the gate terminal G2 of the transistor 10 deteriorates. Thus, feedback via the gate terminal G2 is more likely to occur. In general, in the case where a high-performance transistor having a gain of up to several tens of GHz is used, there is a possibility that the loop gain of the loop formed by this feedback will be greater than or equal to 1. In addition, the off leakage current tends to increase, the higher the performance of the transistor that is used.

With respect to this, the amplification circuit 1 according to this embodiment is characterized in that, even when the high-frequency amplification performances of the transistors 10 and 20 are high, a feedback circuit can be formed in which a feedback signal is attenuated and in that the off leakage current can be suppressed.

1.2 Stability Factor of Amplification Circuit

Figure 3:
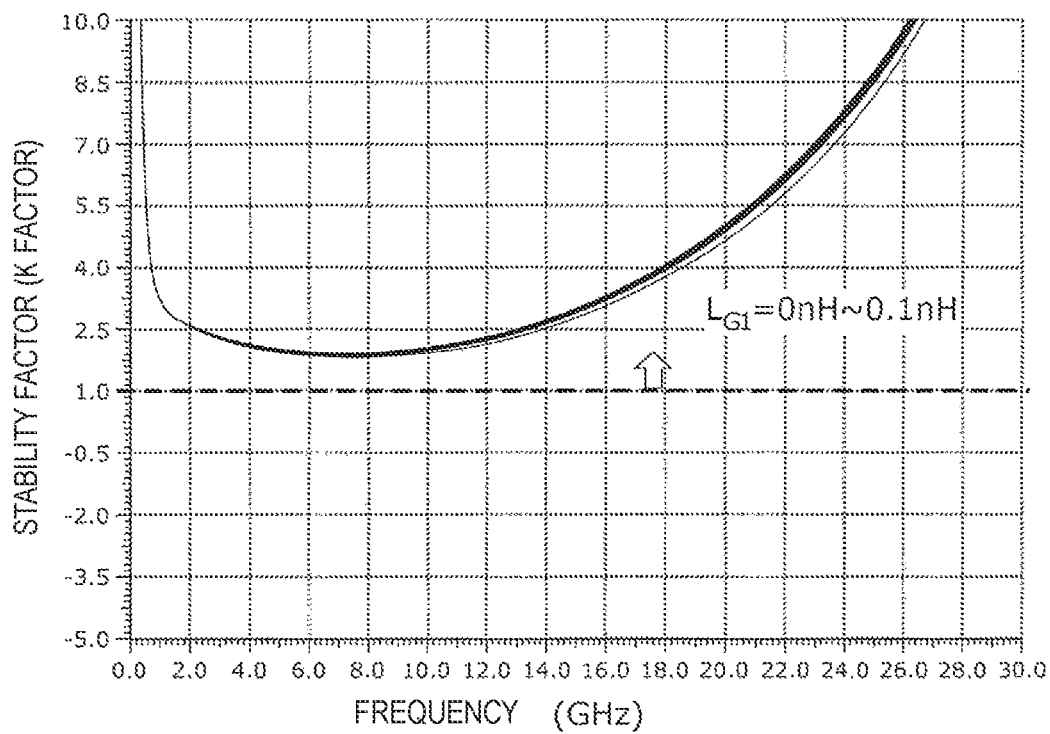
FIG. 3 is a graph illustrating a stability factor of the amplification circuit according to Embodiment 1.

FIG. 3 is a graph illustrating the stability factor of the amplification circuit 1 according to Embodiment 1. This figure illustrates the frequency characteristics of the stability factor (K factor) of the amplification circuit 1 when the value of the parasitic inductance generated at the gate terminal G2 is changed ($L_{G1}$=0 nH to 0.1 nH). As illustrated in the figure, in the amplification circuit 1 according to Embodiment 1, even when the parasitic inductance $L_{G1}$ ($L_{G1}$=0 nH to 0.1 nH) is generated at the gate terminal G2, the loop gain of the loop formed by feedback in a frequency band (~30 GHz) is not greater than or equal to 1. Since the stability factor (K factor) of the amplification circuit 1, which includes a feedback circuit in which there is no possibility of the loop gain being greater than or equal to 1, can be greater than or equal to 1, a stable amplification operation in which oscillation is prevented can be provided.

An amplification circuit 500 of the related art according to a comparative example will be described below for comparison with the amplification circuit 1 according to the embodiment described above.

Figure 4:
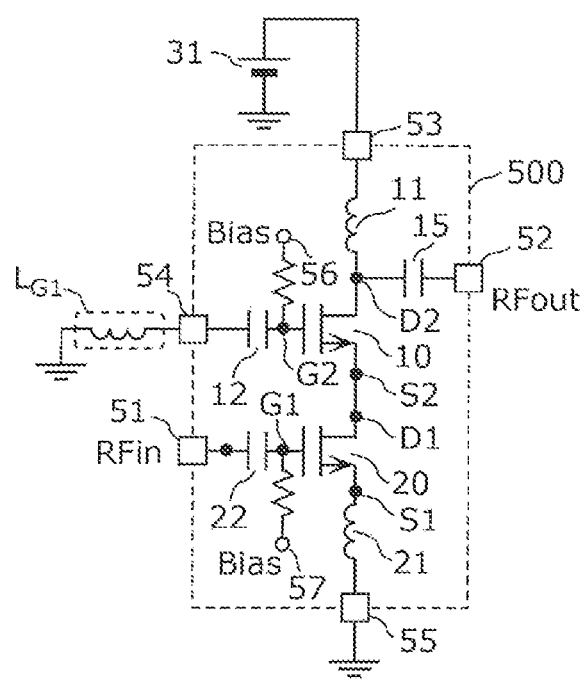
FIG. 4 is a circuit configuration diagram of an amplification circuit according to a comparative example and circuits peripheral thereto.

FIG. 4 is a circuit configuration diagram of the amplification circuit 500 according to the comparative embodiment and circuits peripheral thereto. As illustrated in the figure, the amplification circuit 500 according to the comparative example includes the input terminal 51, the output terminal 52, the power supply terminal 53, the ground terminals 54 and 55, the transistors 10 and 20, the inductors 11 and 21, and the capacitor 15. The configuration of the amplification circuit 500 according to the comparative example differs from the configuration of the amplification circuit 1 according to Embodiment 1 in that: (1) the switch 14 is not disposed; (2) the capacitor 13 is not disposed; and (3) the drain terminal D2 and the ground terminal 54 are not connected to each other via the power supply terminal 53. Hereafter, the description of the amplification circuit 500 according to the comparative example will focus on points that are different from the amplification circuit 1 according to Embodiment 1 and description of points that are the same will be omitted.

In the amplification circuit 500 according to the comparative example, the drain terminal D1 is connected to the source terminal S2, the source terminal S1 is connected to the ground terminal 55 via the inductor 21, and the gate terminal G1 is connected to the input terminal 51 via the capacitor 22. In addition, the drain terminal D2 is connected to the output terminal 52 via the capacitor 15, and the gate terminal G2 is connected to the ground terminal 54 via the capacitor 12. In other words, the transistor 10 is cascode connected to the transistor 20, and the amplification circuit 500 forms a cascode-connection amplification circuit.

Here, the drain terminal D2 and the gate terminal G2 are not connected to each other via the inductor 11 and the power supply terminal 53.

According to the above-described configuration of the amplification circuit 500 according to the comparative example, the gate terminal G2 of the transistor 10 is grounded (in a high-frequency manner via the capacitor 12). At this time, a parasitic inductance component $L_{G1}$ is generated at the gate terminal G2 due to a wiring line or the like used to (high-frequency) ground the gate terminal G2.

Therefore, in the amplification circuit 500, the stability of the transistor is reduced due to the potential of the gate terminal G2 not being (high-frequency) grounded in a fixed manner due to the parasitic inductance component $L_{G1}$, feedback occurs, and an oscillation undesirably occurs when the loop gain is greater than or equal to 1.

In particular, as the frequency becomes higher, the impedance of the parasitic inductance $L_{G1}$ becomes larger and the grounding characteristic of the gate terminal G2 of the transistor 10 deteriorates. Thus, feedback via the gate terminal G2 is more likely to occur. In general, in the case where a high-performance transistor having a gain of up to several tens of GHz is used, there is a possibility that the loop gain of the loop formed by this feedback will be greater than or equal to 1.

Figure 5:
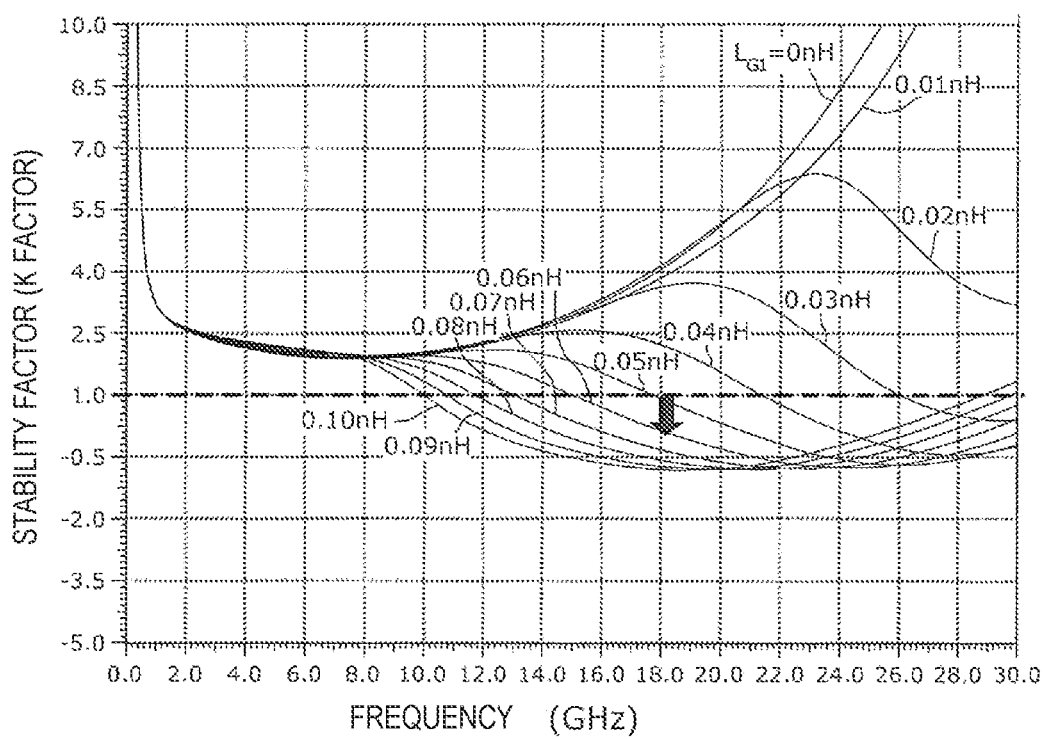
FIG. 5 is a graph illustrating a stability factor of the amplification circuit according to the comparative example.

FIG. 5 is a graph illustrating the stability factor of the amplification circuit 500 according to the comparative embodiment. This figure illustrates the frequency characteristics of the stability factor (K factor) of the amplification circuit 500 when the value of the parasitic inductance generated at the gate terminal G2 is changed ($L_{G1}$=0 nH to 0.1 nH). As illustrated in the figure, in the amplification circuit 500 according to the comparative example, the stability factor (K factor) is degraded when a parasitic inductance greater than or equal to 0.02 nH is generated at the gate terminal G2. Furthermore, as the parasitic inductance $L_{G1}$ increases ($L_{G1}$=0.03 nH or higher), the stability factor (K factor) becomes smaller than 1 in a frequency band of 10 GHz and higher, there is a high possibility of an oscillation being generated, and the amplification operation becomes unstable.

In contrast, in the amplification circuit 1 according to this embodiment, even when the parasitic inductance $L_{G1}$ ($L_{G1}$=0 nH to 0.1 nH) is generated at the gate terminal G2, the stability factor (K factor) in a high-frequency band (~30 GHz) can be made to be greater than or equal to 1, and therefore a stable amplification operation in which oscillation is prevented can be provided.

1.3 Amplification Circuit According to Modification 1

Figure 6A:
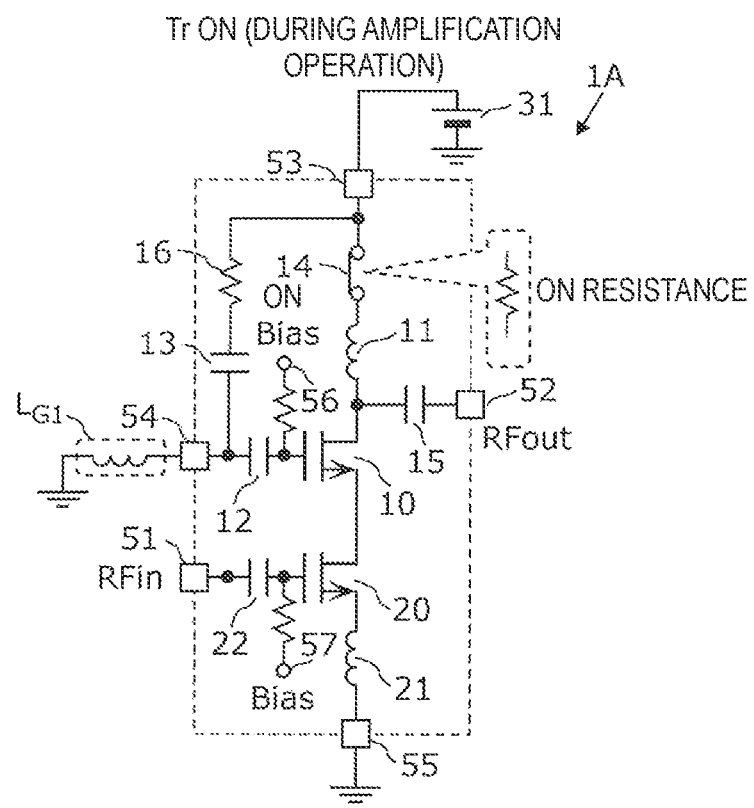
FIG. 6A is a diagram illustrating a circuit state when the amplification circuit according to Modification 1 of Embodiment 1 is operating.

FIG. 6A is a diagram illustrating a circuit state when an amplification circuit 1A according to Modification 1 of Embodiment 1 is operating. In addition, FIG. 6B is a diagram illustrating a circuit state when the amplification circuit 1A according to Modification 1 of Embodiment 1 is not operating.

Figure 6B:
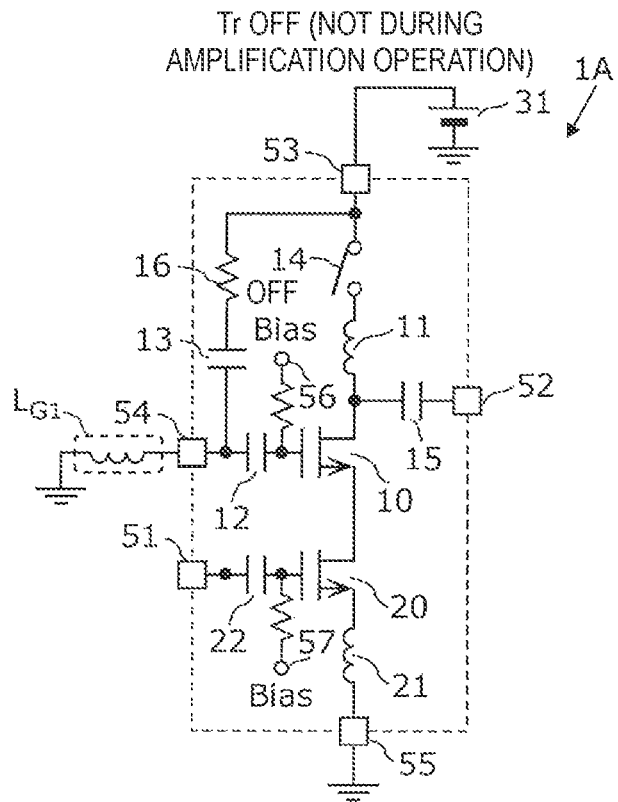
FIG. 6B is a diagram illustrating a circuit state when the amplification circuit according to Modification 1 of Embodiment 1 is not operating.

As illustrated in FIGS. 6A and 6B, the amplification circuit 1A according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistance element 16. The configuration of the amplification circuit 1A according to this modification differs from the configuration of the amplification circuit 1 according to Embodiment 1 only in that the resistance element 16 is additionally provided. Hereafter, the description of the amplification circuit 1A according to Modification 1 will focus on points that are different from the amplification circuit 1 according to Embodiment 1 and description of points that are the same will be omitted.

The resistance element 16 is a second resistance element that is serially disposed between the power supply terminal 53 and the capacitor 13. In addition, it is sufficient that the resistance element 16 be disposed on the second path that connects the gate terminal G2 and the power supply terminal 53 to each other. Thus, the drain terminal D2 and the gate terminal G2 are connected to each other via the inductor 11, the switch 14, the resistance element 16, and the capacitor 13.

In the above-described configuration of the amplification circuit 1A according to this modification, the drain terminal D2 and the gate terminal G2 are connected to each other via the switch 14. Therefore, when the switch 14 is in a conductive state, the drain terminal D2, the inductor 11, the switch 14, the resistance element 16, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the series resistance component formed by the on resistance and the resistance element 16. Therefore, even in the case where the resistance value needed to attenuate the feedback signal is not secured with just the on resistance of the switch 14, sufficient loop attenuation can be realized using the resistance element 16.

The resistance element 16 may be a second resistance element or a second switch element serially disposed on either the first path or the second path. Thus, even in the case where the necessary resistance value is not secured with just the on resistance of the switch 14 when the switch 14 is in a conductive state, sufficient loop attenuation can be realized using a second resistive element.

In addition, a high-frequency signal is allowed to selectively pass along the second path by the capacitor 13 disposed on the second path. Thus, even when the parasitic inductance is generated at the gate terminal, a high-frequency feedback signal between the drain terminal D2 and the gate terminal G2 is attenuated by this loop, and therefore a stable amplification circuit 1A in which oscillation is prevented can be provided.

In the case where the amplification circuit 1A is not performing an amplification operation, the switch 14 is in a non-conductive state, and therefore a so-called off leakage current that flows from the power supply terminal 53 to the ground terminal 55 via the drain terminal D2, the source terminal S2, the drain terminal D1, and the source terminal S1 can be suppressed. From this point of view, the switch 14 is preferably disposed on the first path. However, from the viewpoint of the feedback circuit being able to form a loop that does not have a loop gain of greater than or equal to 1 (feedback signal is attenuated) due to the on resistance of the switch 14, the switch 14 may be disposed on the second path that connects the gate terminal G2, the capacitor 13, the resistance element 16, and the power supply terminal 53 to each other.

In addition, the switch 14 may be a first resistance element (first resistive element) rather than a switch element that switches between a conductive state and a non-conductive state. However, in this case, the effect of being able to suppress the off leakage current using the first resistance element is low. Therefore, the first resistance element may be disposed on either the first path or the second path, and the degree of attenuation of the feedback signal can be adjusted using two resistance elements consisting of the first resistance element and the resistance element 16 (second resistance element).

In addition, as illustrated in FIG. 6A, when a high-frequency signal (RFin) is input and the amplification circuit 1A performs an amplification operation, the switch 14 is a conductive state. On the other hand, as illustrated in FIG. 6B, when the amplification circuit 1A is not performing an amplification operation, the switch 14 is in a non-conductive state.

The switch 14 has an on resistance when in a conductive state when an amplification operation is being performed and therefore the feedback signal between the drain terminal D2 and the gate terminal G2 is attenuated and the stable amplification circuit 1A in which oscillation is prevented can be provided. On the other hand, when an amplification operation is not being performed, the switch 14 is in a non-conductive state and a so-called off leakage current that flows from the power supply terminal 53 to the ground terminal 55 via the drain terminal D2, the source terminal S2, the drain terminal D1, and the source terminal S1 can be suppressed 1.4 Amplification Circuit According to Modification 2

Figure 7:
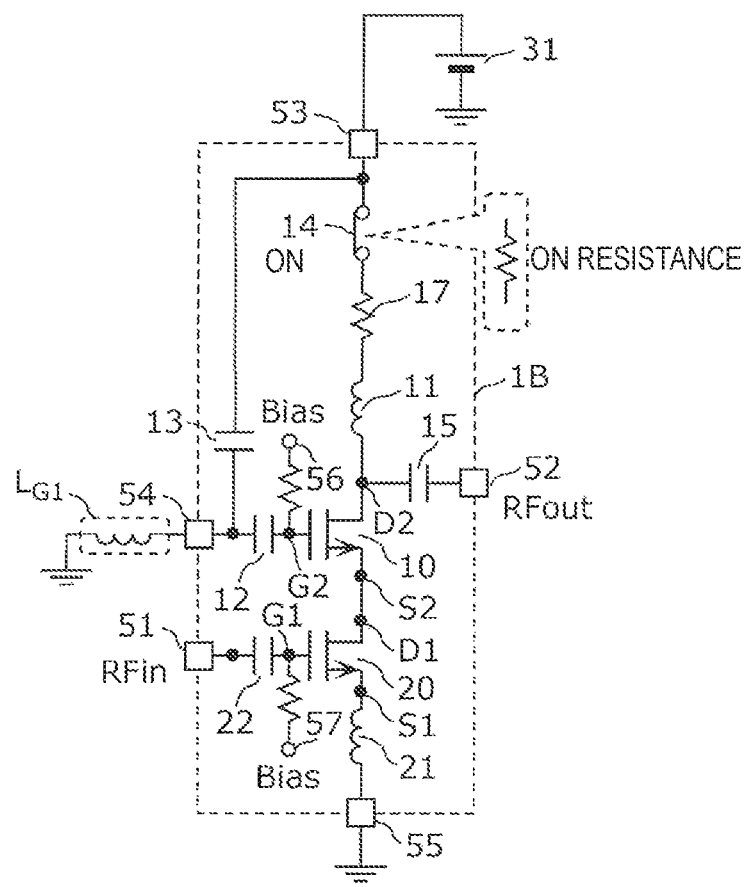
FIG. 7 is a circuit configuration diagram of an amplification circuit according to Modification 2 of Embodiment 1 and circuits peripheral thereto.

FIG. 7 is a circuit configuration diagram of an amplification circuit 1B according to Modification 2 of Embodiment 1 and circuits peripheral thereto. As illustrated in FIG. 7, the amplification circuit 1B according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistance element 17. The configuration of the amplification circuit 1B according to this modification differs from the configuration of the amplification circuit 1A according to Modification 1 only in that the resistance element 17 is added instead of the resistance element 16. Hereafter, the description of the amplification circuit 1B according to Modification 2 will focus on points that are different from the amplification circuit 1A according to Modification 1 and description of points that are the same will be omitted.

The resistance element 17 is a second resistance element that is serially disposed between the power supply terminal 53 and the inductor 11. In addition, the resistance element 17 may be disposed on the first path that connects the drain terminal D2 and the power supply terminal 53 to each other. Thus, the drain terminal D2 and the gate terminal G2 are connected to each other via the inductor 11, the resistance element 17, the switch 14, the power supply terminal 53, and the capacitor 13.

In the above-described configuration of the amplification circuit 1B according to this modification, the drain terminal D2 and the gate terminal G2 are connected to each other via the switch 14. Therefore, when the switch 14 is in a conductive state, the drain terminal D2, the inductor 11, the resistance element 17, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the serially connected resistances of the on resistance and the resistance element 17. Therefore, even in the case where the resistance value needed to attenuate the feedback signal is not secured with just the on resistance of the switch 14, sufficient loop attenuation can be realized using the resistance element 17.

In addition, the switch 14 may be a first resistance element (resistive element) rather than a switch element that switches between a conductive state and a non-conductive state. In this case, the effect of being able to suppress the off leakage current using the first resistance element is low. Therefore, the first resistance element may be disposed on either the first path or the second path, and the degree of attenuation of the feedback signal can be adjusted using two resistance elements consisting of the first resistance element and the resistance element 17 (second resistance element).

In addition, the resistance element 17 may be disposed on the first path that connects the drain terminal D2 and the power supply terminal 53 to each other, and as illustrated in FIG. 7, in the case where the resistance element 17 is serially disposed between the power supply terminal 53 and the inductor 11, the resistance element 17 is disposed in a region outside the transistors 10 and 20 and the matching network formed of the inductor 11 and the capacitor 15, and therefore the resistance element 17 does not affect the gain of the amplifier formed by the transistors 10 and 20.

1.5 Amplification Circuit According to Modification 3

Figure 8:
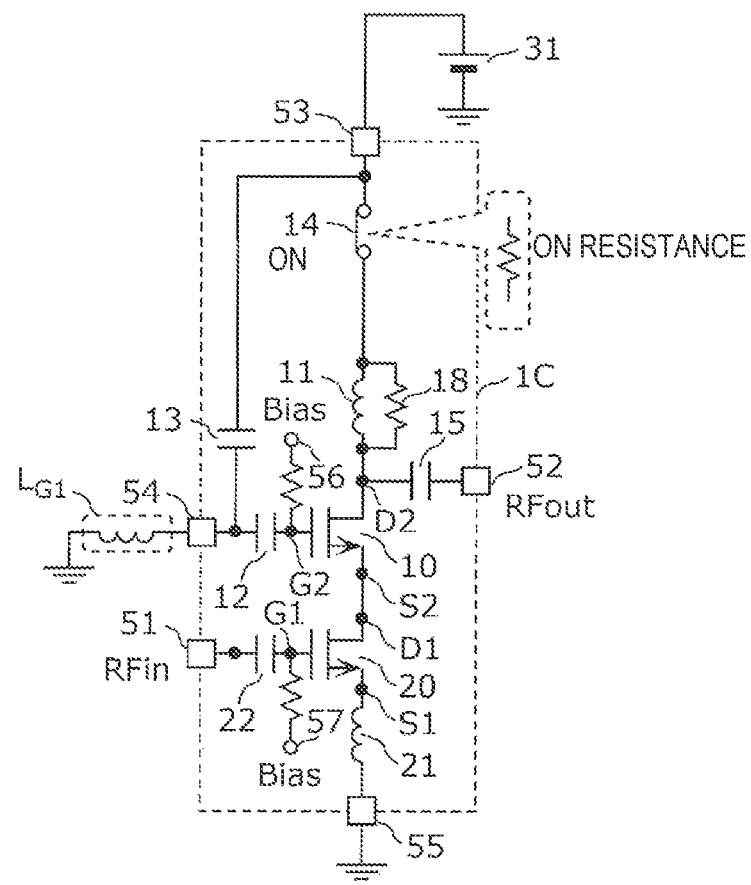
FIG. 8 is a circuit configuration diagram of an amplification circuit according to Modification 3 of Embodiment 1 and circuits peripheral thereto.

FIG. 8 is a circuit configuration diagram of an amplification circuit 1C according to Modification 3 of Embodiment 1 and circuits peripheral thereto. As illustrated in FIG. 8, the amplification circuit 1C according to this modification includes the input terminal 51, the output terminal 52, the power supply terminal 53, the ground terminals 54 and 55, the transistors 10 and 20, the inductors 11 and 21, the capacitors 13 and 15, the switch 14, and a resistance element 18. The configuration of the amplification circuit 1C according to this modification differs from the configuration of the amplification circuit 1B according to Modification 2 only in that the resistance element 18 is added instead of the resistance element 17. Hereafter, the description of the amplification circuit 1C according to Modification 3 will focus on points that are different from the amplification circuit 1B according to Modification 2 and description of points that are the same will be omitted.

The resistance element 18 is a third resistance element that connected in parallel with the inductor 11. Thus, the drain terminal D2 and the gate terminal G2 are connected to each other via a parallel connection circuit consisting of the inductor 11 and the resistance element 18 and via the switch 14, the power supply terminal 53, and the capacitor 13.

In the above-described configuration of the amplification circuit 1C according to this modification, the drain terminal D2 and the gate terminal G2 are connected to each other via the switch 14. Therefore, when the switch 14 is in a conductive state, the drain terminal D2, the parallel connection circuit, the switch 14, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to a series connection circuit consisting of the on resistance and the parallel connection circuit. Therefore, even in the case where the resistance value needed to attenuate the feedback signal is not secured with just the on resistance of the switch 14, sufficient loop attenuation can be realized using the resistance element 18.

In addition, the switch 14 may be a first resistance element (resistive element) rather than a switch element that switches between a conductive state and a non-conductive state. In this case, the effect of being able to suppress the off leakage current using the first resistance element is low. Therefore, the first resistance element may be disposed on either the first path or the second path, and the degree of attenuation of the feedback signal can be adjusted using two resistance elements consisting of the first resistance element and the resistance element 18 (third resistance element).

1.6 Amplification Circuit According to Modification 4

Figure 9:
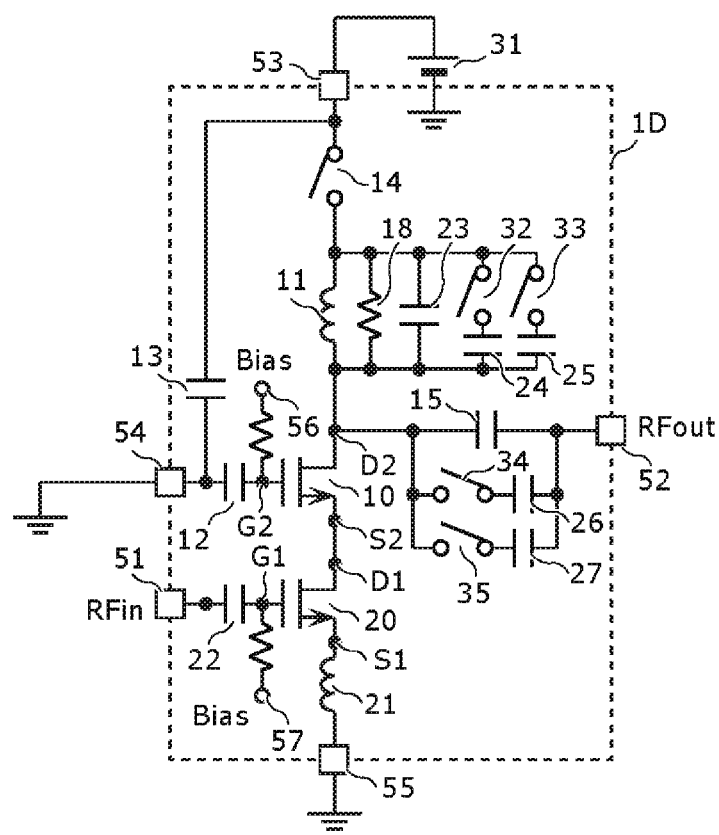
FIG. 9 is a circuit configuration diagram of an amplification circuit according to Modification 4 of Embodiment 1 and circuits peripheral thereto.

FIG. 9 is a circuit configuration diagram of an amplification circuit 1D according to Modification 4 of Embodiment 1 and circuits peripheral thereto. As illustrated in FIG. 9, the amplification circuit 1D according to this modification includes the input terminal 51, the output terminal 52, the power supply terminal 53, the ground terminals 54 and 55, the transistors 10 and 20, the inductors 11 and 21, capacitors 12, 13, 15, 22, 23, 24, 25, 26, and 27, switches 14, 32, 33, 34, and 35, and the resistance element 18. The configuration of the amplification circuit 1D according to this modification differs from the configuration of the amplification circuit 1C according to Modification 3 in that the capacitors 23 to 27 and the switches 32 to 35 are additionally provided. Hereafter, the description of the amplification circuit 1D according to Modification 4 will focus on points that are different from the amplification circuit 1C according to Modification 3 and description of points that are the same will be omitted.

The capacitor 23 is an example of a third capacitance element and is connected in parallel with the inductor 11. Thus, the inductor 11 and the capacitor 23 form a parallel resonance circuit and the gain at the parallel resonant frequency can be increased.

The capacitor 24 (example of fourth capacitance element) and the switch 32 (example of third switch element) are connected in series with each other and form a first series circuit. The capacitor 25 and the switch 33 are connected in series with each other and form a third series circuit. The first series circuit and the third series circuit are each connected in parallel with the inductor 11. Note that the third series circuit may be omitted.

The parallel resonant frequency of the parallel resonance circuit consisting of the inductor 11 and the capacitor 23 can be changed by switching each of the switches 32 and 33 to either a conductive (on) state or non-conductive (off) state. Therefore, the frequency can be adjusted over a wide range of frequencies to achieve a high gain.

This adjustment may be performed at the time of manufacture (trimming) of the amplification circuit 1D, the states of the switches 32 and 33 may be fixed during use, or the states of the switches 32 and 33 may be varied in accordance with the frequency of a high-frequency signal being transmitted during use of the amplification circuit 1D.

The Q value of the parallel resonance circuit can be reduced by the resistance element 18 (third resistance element), and therefore oscillation of the amplification circuit 1D at frequencies where gain is high can be suppressed.

The capacitor 26 (example of fifth capacitance element) and the switch 34 (example of fourth switch element) are connected in series with each other and form a second series circuit. The capacitor 27 and the switch 35 are connected in series with each other and form a fourth series circuit. The second series circuit and the fourth series circuit are each connected in parallel with the capacitor 15. Note that the fourth series circuit may be omitted.

By switching each of the switches 34 and 35 to either a conductive (on) state or a non-conductive (off) state, it is possible to adjust the frequency and impedance at which impedance matching is to be realized with an externally connected circuit connected to the output terminal 52 over a wide range of frequencies.

This adjustment may be performed at the time of manufacture (trimming) of the amplification circuit 1D, the states of the switches 34 and 35 may be fixed during use, or the states of the switches 34 and 35 may be varied in accordance with the frequency of a high-frequency signal being transmitted during use of the amplification circuit 1D.

A low pass filter may be connected between the drain terminal D2 and the output terminal 52 instead of the capacitor 15, the second series circuit, and the fourth series circuit. The low pass filter may be a surface-mount type filter, a multilayer substrate embedded type filter, or an integrated passive device (IPD) filter. The low pass filter is disposed in order to suppress distortion signals such as higher harmonics generated by the transistor 10 or 20. On the other hand, since the above-mentioned higher harmonics are reflected by the low-pass filter, there is a risk of oscillations at specific frequencies (frequencies of higher harmonics) as seen from the transistor 10. Even in this case, in the amplification circuit 1D according to this modification, loop gain is reduced by the switch 14 and a loop not having a loop gain greater than or equal to 1 can be formed. The potential of the gate terminal G2 is isolated from the power supply potential by the capacitor 13 disposed on the second path. Thus, even when a parasitic inductance component is generated at the gate terminal G2, the high-frequency feedback signal is attenuated, and therefore the stable amplification circuit 1D in which oscillation is prevented can be provided.

As illustrated in FIG. 9, an impedance element such as a resistance element or an inductor may be connected between the gate terminal G2 and the bias terminal 56.

1.7 Amplification Circuit According to Modification 5

Figure 10:
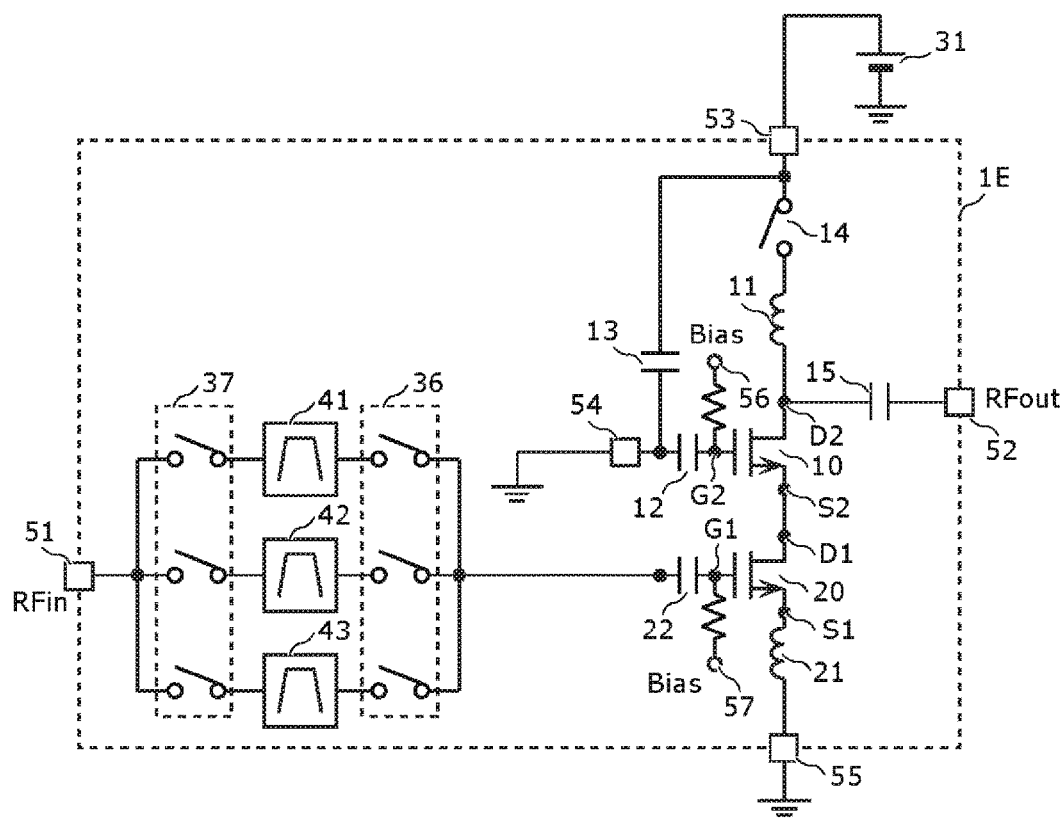
FIG. 10 is a circuit configuration diagram of an amplification circuit according to Modification 5 of Embodiment 1 and circuits peripheral thereto.

FIG. 10 is a circuit configuration diagram of an amplification circuit 1E according to Modification 5 of Embodiment 1 and circuits peripheral thereto. As illustrated in FIG. 10, the amplification circuit 1E according to this modification includes the input terminal 51, the output terminal 52, the power supply terminal 53, the ground terminals 54 and 55, the transistors 10 and 20, the inductors 11 and 21, capacitors 12, 13, 15, and 22, switches 14, 36, and 37, and filters 41, 42, and 43. The configuration of the amplification circuit 1E according to this modification differs from the configuration of the amplification circuit 1 according to Embodiment 1 in that the filters 41 to 43 and the switches 36 and 37 are additionally provided. Hereafter, the description of the amplification circuit 1E according to Modification 5 will focus on points that are different from the amplification circuit 1 according to Embodiment 1 and description of points that are the same will be omitted.

The filters 41 to 43 are each connected between the input terminal 51 and the gate terminal G1. The filters 41 to 43 have different frequency bands as the pass bands thereof. The filters 41 to 43 may respectively be a band pass filter, a low pass filter, and a high pass filter. The filters 41 to 43 may each be a surface-mount type filter, a multilayer substrate embedded type filter, or an IPD filter.

The switch 37 is an example of a first switch circuit, is connected between the input terminal 51 and the filters 41 to 43, and switches a connection between the input terminal 51 and any one of the filters 41 to 43. The switch 36 is an example of a second switch circuit, is connected between the filters 41 to 43 and the gate terminal G1, and switches a connection between the gate terminal G1 and any one of the filters 41 to 43.

With the above configuration, as a result of the filters 41 to 43 being disposed, the frequencies at which the amplification circuit 1E has gain can be restricted and unwanted waves can be suppressed. By switching the filters 41 to 43, the conditions under which a signal source impedance can be obtained at particular frequencies as seen from the transistor 20 are broadened, resulting in an increased risk of the amplification circuit 1E oscillating at any frequency, but a high-frequency feedback signal can be attenuated by the switch 14 and the capacitor 13 even if a parasitic inductance component is generated at the gate terminal G2, and the stable amplification circuit 1E in which oscillation is prevented can be provided.

1.8 Amplification Circuit According to Modification 6

Figure 11:
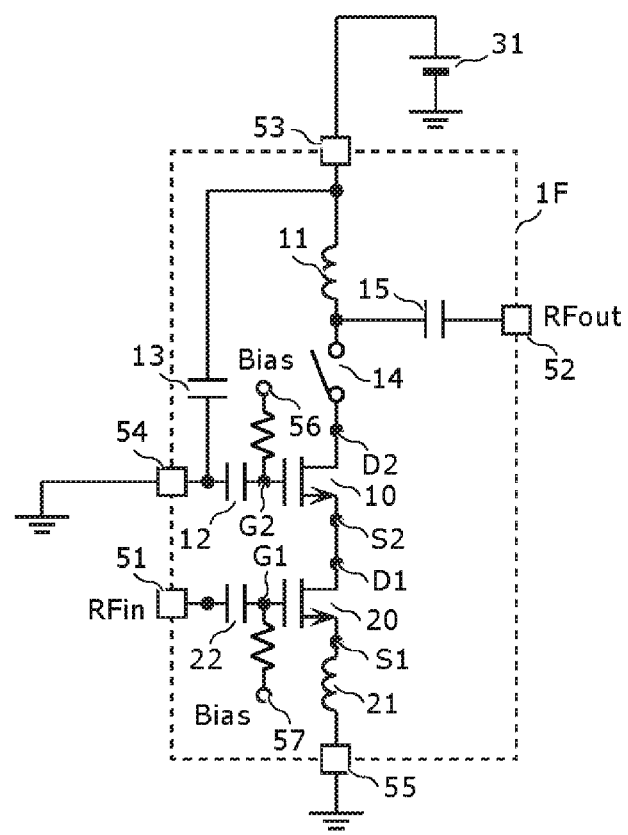
FIG. 11 is a circuit configuration diagram of an amplification circuit according to Modification 6 of Embodiment 1 and circuits peripheral thereto.

FIG. 11 is a circuit configuration diagram of an amplification circuit 1F according to Modification 6 of Embodiment 1 and circuits peripheral thereto. As illustrated in FIG. 11, the amplification circuit 1F according to this modification includes the input terminal 51, the output terminal 52, the power supply terminal 53, the ground terminals 54 and 55, the transistors 10 and 20, the inductors 11 and 21, the capacitors 12, 13, 15, and 22, and the switch 14. The amplification circuit 1F according to this modification differs from the amplification circuit 1 according to Embodiment 1 with respect to the connection between the switch 14 and the inductor 11. Hereafter, the description of the amplification circuit 1F according to Modification 6 will focus on points that are different from the amplification circuit 1 according to Embodiment 1 and description of points that are the same will be omitted.

The inductor 11 is an example of a first inductance element and is serially disposed on the first path connected between the drain terminal D2 and the power supply terminal 53 to each other. The inductor 11 is serially disposed on either the first path or the second path between the switch 14 and the gate terminal G2.

The capacitor 15 is an example of a second capacitance element and is serially disposed between the drain terminal D2 and the output terminal 52.

The switch 14 is a switch element that is serially disposed on the first path that connects the drain terminal D2 and the power supply terminal 53 to each other and is a so-called first resistive element that functions as a resistance element having an on resistance when in a conductive state.

In other words, according to the above connection configuration, the drain terminal D2 and the gate terminal G2 are connected to each other via the switch 14, the inductor 11, and the capacitor 13.

In the above-described configuration of the amplification circuit 1F according to this modification, the drain terminal D2, which is connected to the output terminal 52, and the grounded gate terminal G2 are (high-frequency) connected to each other via the switch 14. Therefore, when the switch 14 is in a conductive state, the drain terminal D2, the switch 14, the inductor 11, the capacitor 13, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the on resistance. In other words, a high-frequency signal output from the drain terminal D2 is returned via the loop in an attenuated state without passing through a parasitic capacitance or the like generated in the vicinity of the transistor 10. In addition, the potential of the ground terminal 54 is isolated from the power supply potential by the capacitor 13 disposed on the second path. Thus, even when a parasitic inductance component is generated at the gate terminal G2, feedback signals in both directions between the drain terminal D2 and the gate terminal G2 are attenuated by this loop, and therefore the stable amplification circuit 1F in which oscillation is prevented can be provided.

When the amplification circuit 1F is not performing an amplification operation, the switch 14 is in a non-conductive state, and therefore a so-called off leakage current of the transistors 10 and 20 that flows from the power supply terminal 53 to the ground terminal 55 via the drain terminal D2, the source terminal S2, the drain terminal D1, and the source terminal S1 can be suppressed. From this point of view, it is preferable that the switch 14 be disposed on the first path out of the first path and the second path. However, from the viewpoint of the feedback circuit being able to form a loop that does not have a loop gain greater than or equal to 1 (feedback signal is attenuated) due to the on resistance of the switch 14, the switch 14 may be disposed on the second path that connects the gate terminal G2, the capacitor 13, and the power supply terminal 53 to each other.

1.9 Amplification Circuit According to Modification 7

Figure 12:
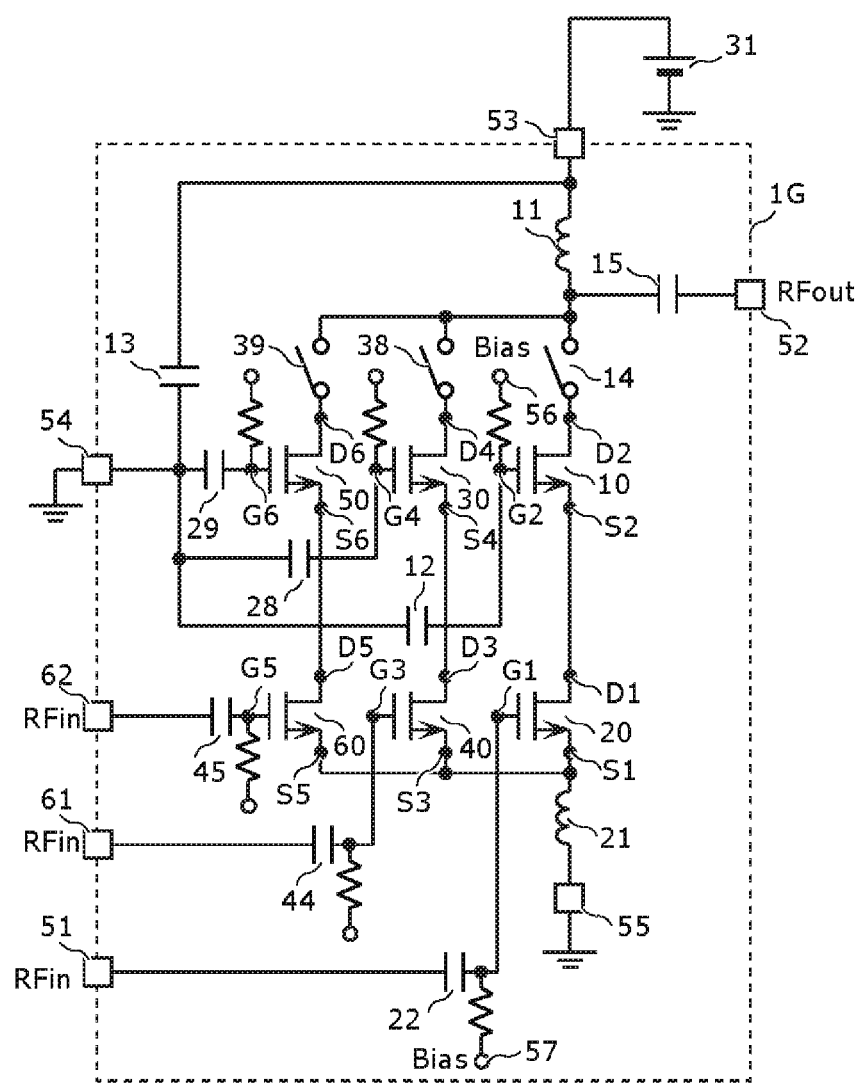
FIG. 12 is a circuit configuration diagram of an amplification circuit according to Modification 7 of Embodiment 1 and circuits peripheral thereto.

FIG. 12 is a circuit configuration diagram of an amplification circuit 1G according to Modification 7 of Embodiment 1 and circuits peripheral thereto. As illustrated in FIG. 12, the amplification circuit 1G according to this modification includes input terminals 51, 61, and 62, the output terminal 52, the power supply terminal 53, the ground terminals 54 and 55, transistors 10, 20, 30, 40, 50, and 60, the inductors 11 and 21, capacitors 12, 13, 15, 22, 28, 29, 44, and 45, and switches 14, 38, and 39. The amplification circuit 1G according to this modification differs from the amplification circuit 1F according to Modification 6 in that the cascode-connected transistors 10 and 20, the cascode-connected transistors 30 and 40, and the cascode-connected transistors 50 and 60 are connected in parallel between the power supply terminal 53 and the ground terminal 55 via switches. Hereafter, the description of the amplification circuit 1G according to Modification 7 will focus on points that are different from the amplification circuit 1F according to Modification 6 and description of points that are the same will be omitted.

The power supply terminal 53 is connected to a power supply 31 that generates a direct-current power supply voltage. In addition, the ground terminals 54 and 55 are grounded. A high-frequency signal (RFin) is input to each of the input terminal 51 (example of first input terminal), the input terminal 61 (example of second input terminal), and the input terminal 62. A high-frequency signal (RFout) amplified by the transistors 10 and 20, a high-frequency signal (RFout) amplified by the transistors 30 and 40, or a high-frequency signal (RFout) amplified by the transistors 50 and 60 is output from the output terminal 52.

The transistor 20 is an example of a first transistor and has a source terminal S1 (first terminal), a drain terminal D1 (second terminal), and a gate terminal G1 (first control terminal). The transistor 10 is an example of a second transistor and has a source terminal S2 (third terminal), a drain terminal D2 (fourth terminal), and a gate terminal G2 (second control terminal).

The drain terminal D1 is connected to the source terminal S2, the source terminal S1 is connected to the ground terminal 55 via the inductor 21, and the gate terminal G1 is connected to the input terminal 51 via the capacitor 22. In addition, the drain terminal D2 is connected to the output terminal 52 via the switch 14 and the capacitor 15, and the gate terminal G2 is connected to the ground terminal 54 via the capacitor 12. In other words, the transistor 10 is cascode connected to the transistor 20.

The transistor 40 is an example of a third transistor and has a source terminal S3 (fifth terminal), a drain terminal D3 (sixth terminal), and a gate terminal G3 (third control terminal). The transistor 30 is an example of a fourth transistor and has a source terminal S4 (seventh terminal), a drain terminal D4 (eighth terminal), and a gate terminal G4 (fourth control terminal).

The drain terminal D3 is connected to the source terminal S4, the source terminal S3 is connected to the ground terminal 55 via the inductor 21, and the gate terminal G3 is connected to the input terminal 61 via the capacitor 44. In addition, the drain terminal D4 is connected to the output terminal 52 via the switch 38 and the capacitor 15, and the gate terminal G4 is connected to the ground terminal 54 via the capacitor 28. In other words, the transistor 30 is cascode connected to the transistor 40.

The transistor 60 has a source terminal S5, a drain terminal D5, and a gate terminal G5. The transistor 50 has a source terminal S6, a drain terminal D6, and a gate terminal G6.

The drain terminal D5 is connected to the source terminal S6, the source terminal S5 is connected to the ground terminal 55 via the inductor 21, and the gate terminal G5 is connected to the input terminal 62 via the capacitor 45. In addition, the drain terminal D6 is connected to the output terminal 52 via the switch 39 and the capacitor 15, and the gate terminal G6 is connected to the ground terminal 54 via the capacitor 29. In other words, the transistor 50 is cascode connected to the transistor 60.

The switch 14 is an example of a first switch element and is serially disposed between the inductor 11 and the drain terminal D2. The switch 38 is an example of a third switch element and is serially disposed between the inductor 11 and the drain terminal D4. The switch 39 is serially disposed between the inductor 11 and the drain terminal D6.

The inductor 11 is serially disposed on the first path connected between the drain terminal D2 and the power supply terminal 53. The first path includes a path connecting the drain terminal D4 and the power supply terminal 53 to each other and a path connecting the drain terminal D6 and the power supply terminal 53 to each other. In other words, the first path connects the drain terminal D2 and the power supply terminal 53 to each other, connects the drain terminal D4 and the power supply terminal 53 to each other, and connects the drain terminal D6 and the power supply terminal 53 to each other.

The capacitor 13 is an example of a first capacitance element and is serially disposed on the second path connected between the gate terminal G2 and the power supply terminal 53. The second path includes a path connecting the gate terminal G4 and the power supply terminal 53 to each other and a path connecting the gate terminal G6 and the power supply terminal 53 to each other. In other words, the second path connects the gate terminal G2 and the power supply terminal 53 to each other, connects the gate terminal G4 and the power supply terminal 53 to each other, and connects the gate terminal G6 and the power supply terminal 53 to each other.

The capacitor 15 is a second capacitance element serially disposed between the switch 14 and the output terminal 52, between the switch 38 and the output terminal 52, and between the switch 39 and the output terminal 52.

According to the above connection configuration, the drain terminal D2 and the gate terminal G2 are connected to each other via the switch 14, the inductor 11, and the capacitor 13. In addition, the drain terminal D4 and the gate terminal G4 are connected to each other via the switch 38, the inductor 11, and the capacitor 13. The drain terminal D6 and the gate terminal G6 are connected to each other via the switch 39, the inductor 11, and the capacitor 13.

In this configuration, the amplification path for a high-frequency signal input from any of the input terminals 51, 61, and 62 is selected by switching the switches 14, 38, and 39. Since high-frequency signals input from the input terminals 51, 61, and 62 are signals of different bands and communication methods, the amplification circuit 1G needs to support amplification of signals across a wide frequency band. Therefore, there is concern that the amplification circuit 1G may oscillate at any of the frequencies within the wide frequency band.

Regarding this issue, in the configuration of the amplification circuit 1G according to this modification, the drain terminal D2, which is connected to the output terminal 52, and the gate terminal G2 are (high-frequency) connected to each other via the switch 14, the drain terminal D4, which is connected to the output terminal 52, and the gate terminal G4 are (high-frequency) connected to each other via the switch 38, and the drain terminal D6, which is connected to the output terminal 52, and the gate terminal G6 are (high-frequency) connected to each other via the switch 39. Therefore, when the switch 14 is in a conductive state, the drain terminal D2, the switch 14, the inductor 11, the capacitor 13, and the gate terminal G2 form a first feedback circuit for a high-frequency signal between the drain terminal D2 and the gate terminal G2. In addition, when the switch 38 is in a conductive state, the drain terminal D4, the switch 38, the inductor 11, the capacitor 13, and the gate terminal G4 form a second feedback circuit for a high-frequency signal between the drain terminal D4 and the gate terminal G4. In addition, when the switch 39 is in a conductive state, the drain terminal D6, the switch 39, the inductor 11, the capacitor 13, and the gate terminal G6 form a third feedback circuit for a high-frequency signal between the drain terminal D6 and the gate terminal G6.

Here, the switch 14 has an on resistance when in a conductive state, and therefore the first feedback circuit forms a loop that does not have a loop gain that is greater than or equal to 1 (feedback signal is attenuated) due to the on resistance. In other words, a high-frequency signal output from the drain terminal D2 is returned via the loop in an attenuated state without passing through a parasitic capacitance or the like generated in the vicinity of the transistor 10. In addition, the potential of the ground terminal 54 is isolated from the power supply potential by the capacitor 13 disposed on the second path. Thus, even when a parasitic inductance component is generated at the gate terminal G2, feedback signals in both directions between the drain terminal D2 and the gate terminal G2 are attenuated by this loop.

The switch 38 has an on resistance when in a conductive state, and therefore the second feedback circuit forms a loop that does not have a loop gain that is greater than or equal to 1 (feedback signal is attenuated) due to the on resistance. In other words, a high-frequency signal output from the drain terminal D4 is returned via the loop in an attenuated state without passing through a parasitic capacitance or the like generated in the vicinity of the transistor 30. In addition, the potential of the ground terminal 54 is isolated from the power supply potential by the capacitor 13 disposed on the second path. Thus, even when a parasitic inductance component is generated at the gate terminal G4, feedback signals in both directions between the drain terminal D4 and the gate terminal G4 are attenuated by this loop.

The switch 39 has an on resistance when in a conductive state, and therefore the third feedback circuit forms a loop that does not have a loop gain that is greater than or equal to 1 (feedback signal is attenuated) due to the on resistance. In other words, a high-frequency signal output from the drain terminal D6 is returned via the loop in an attenuated state without passing through a parasitic capacitance or the like generated in the vicinity of the transistor 50. In addition, the potential of the ground terminal 54 is isolated from the power supply potential by the capacitor 13 disposed on the second path. Thus, even when a parasitic inductance component is generated at the gate terminal G6, feedback signals in both directions between the drain terminal D6 and the gate terminal G6 are attenuated by this loop.

Therefore, the stable amplification circuit 1G in which oscillation is prevented can be provided.

In addition, rather than disposing the inductor 11 on each of a path formed of the cascode-connected transistors 10 and 20, a path formed of the cascode-connected transistors 30 and 40, and a path formed of the cascode-connected transistors 50 and 60, a single inductor 11 is serially disposed on the first path to which these paths are commonly connected via the switches 14, 38, and 39. Therefore the amplification circuit 1G can be reduced in size.

Note that the path formed of the cascode-connected transistors 50 and 60 is not an essential constituent element of the amplification circuit 1G according to this modification. In the amplification circuit 1G according to this modification, it is sufficient if two or more paths formed of two cascode-connected transistors are disposed.

1.10 Amplification Circuit According to Modification 8

Figure 13:
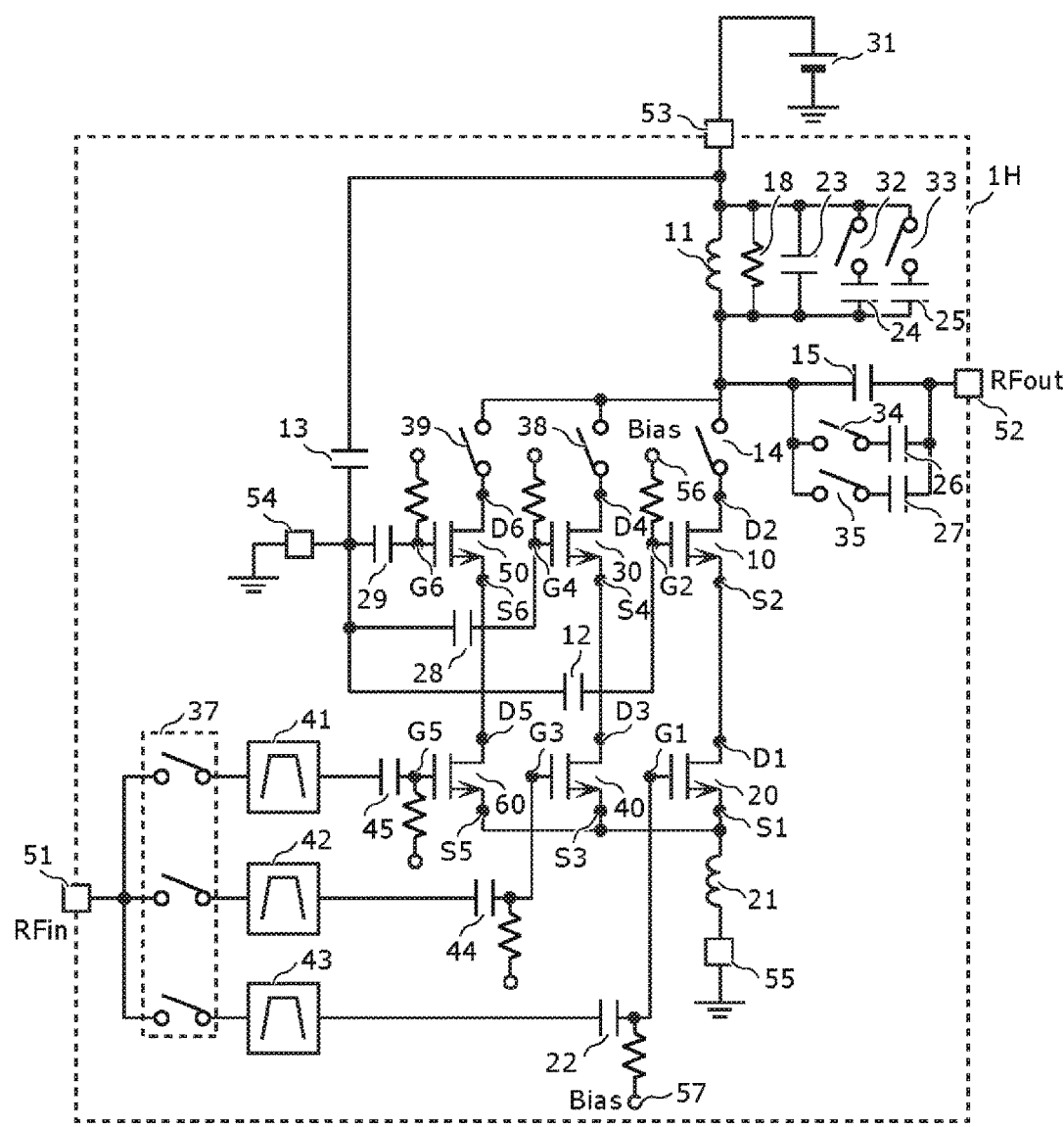
FIG. 13 is a circuit configuration diagram of an amplification circuit according to Modification 8 of Embodiment 1 and circuits peripheral thereto.

FIG. 13 is a circuit configuration diagram of an amplification circuit 1H according to Modification 8 of Embodiment 1 and circuits peripheral thereto. As illustrated in FIG. 13, the amplification circuit 1H according to this modification includes the input terminal 51, the output terminal 52, the power supply terminal 53, the ground terminals 54 and 55, transistors 10, 20, 30, 40, 50, and 60, the inductors 11 and 21, capacitors 12, 13, 15, 22, 23, 24, 25, 26, 27, 28, 29, 44, and 45, switches 14, 32, 33, 34, 35, 37, 38, and 39, the filters 41, 42, and 43, and the resistance element 18. The amplification circuit 1H according to this modification differs from the amplification circuit 1G according to Modification 7 in that the resistance element 18, the capacitors 23 to 27, and the switches 32 to 35 are additionally provided and in that the filters 41 to 43 and the switch 37 are additionally provided. Hereafter, the description of the amplification circuit 1H according to Modification 8 will focus on points that are different from the amplification circuit 1G according to Modification 7 and description of points that are the same will be omitted.

The resistance element 18 is an example of a third resistance element and is connected in parallel with the inductor 11.

The capacitor 23 is an example of a third capacitance element and is connected in parallel with the inductor 11. Thus, the inductor 11 and the capacitor 23 form a parallel resonance circuit and the gain at the parallel resonant frequency can be increased.

The capacitor 24 (example of fourth capacitance element) and the switch 32 (example of third switch element) are connected in series with each other and form a first series circuit. The capacitor 25 and the switch 33 are connected in series with each other and form a third series circuit. The first series circuit and the third series circuit are each connected in parallel with the inductor 11. Note that the third series circuit may be omitted.

The parallel resonant frequency of the parallel resonance circuit consisting of the inductor 11 and the capacitor 23 can be changed by switching each of the switches 32 and 33 to either a conductive (on) state or non-conductive (off) state. Therefore, the frequency can be adjusted over a wide range of frequencies to achieve a high gain.

This adjustment may be performed at the time of manufacture (trimming) of the amplification circuit 1H, the states of the switches 32 and 33 may be fixed during use, or the states of the switches 32 and 33 may be varied in accordance with the frequency of a high-frequency signal being transmitted during use of the amplification circuit 1H.

The Q value of the parallel resonance circuit can be reduced by the resistance element 18, and therefore oscillation of the amplification circuit 1H at frequencies where gain is high can be suppressed.

The capacitor 26 (example of fifth capacitance element) and the switch 34 (example of fourth switch element) are connected in series with each other and form a second series circuit. The capacitor 27 and the switch 35 are connected in series with each other and form a fourth series circuit. The second series circuit and the fourth series circuit are each connected in parallel with the capacitor 15. Note that the fourth series circuit may be omitted.

By switching each of the switches 34 and 35 to either a conductive (on) state or a non-conductive (off) state, it is possible to adjust the frequency and impedance at which impedance matching is to be realized with an externally connected circuit connected to the output terminal 52 over a wide range of frequencies.

This adjustment may be performed at the time of manufacture (trimming) of the amplification circuit 1H, the states of the switches 34 and 35 may be fixed during use, or the states of the switches 34 and 35 may be varied in accordance with the frequency of a high-frequency signal being transmitted during use of the amplification circuit 1H.

The filter 41 is connected between the input terminal 51 and the gate terminal G5. The filter 42 is an example of a second filter and is connected between the input terminal 51 and the gate terminal G3 (example of third control terminal). The filter 43 is an example of a first filter and is connected between the input terminal 51 and the gate terminal G1 (example of first control terminal). The filters 41 to 43 have different frequency bands as the pass bands thereof. The filters 41 to 43 may respectively be a band pass filter, a low pass filter, and a high pass filter. The filters 41 to 43 may each be a surface-mount type filter, a multilayer substrate embedded type filter, or an IPD filter.

The switch 37 is connected between the input terminal 51 and the filters 41 to 43 and switches the connection between the input terminal 51 and any of the filters 41 to 43.

With this configuration, unwanted waves can be suppressed as a result of the filters 41 to 43 being disposed. In addition, the gain and noise figure of the amplification circuit 1H can be optimized for each selected frequency band.

In the amplification circuit 1H according to this modification as well, a high-frequency feedback signal is attenuated by the switches 14, 38, and 39 and the capacitor 13 even when parasitic inductance components are generated at the gate terminals G2, G4, and G6 and the stable amplification circuit 1H in which oscillation is prevented can be provided.

1.11 Mounting Configuration of Amplification Circuit

Figure 14:
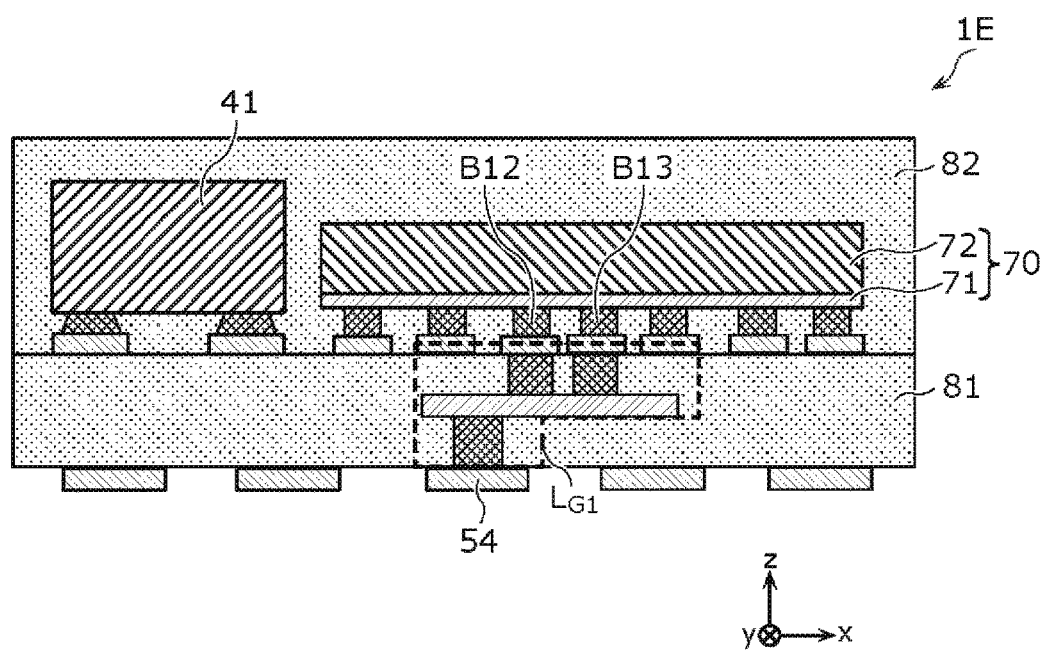
FIG. 14 is a sectional view of an amplification circuit according to Modification 5 of Embodiment 1.

FIG. 14 is a sectional view of the amplification circuit 1E according to Modification 5 of Embodiment 1. As illustrated in FIG. 14, the amplification circuit 1E according to this modification includes a semiconductor IC 70 and resin members 81 and 82 in addition to the circuit configuration illustrated in FIG. 10.

The semiconductor IC 70 consists of a support substrate 72 and a circuit section 71. The support substrate 72 is a semiconductor substrate composed of S1, for example. The circuit section 71 is disposed on a main surface of the support substrate 72 on the side near the resin member 81 out of the opposing main surfaces of the support substrate 72, and includes the transistors 10 and 20, the inductors 11 and 21, the capacitors 13 and 15, and the switches 14, 36, and 37.

The semiconductor IC 70 and the filters 41 to 43 are disposed on a main surface of the resin member 81. The resin member 81 is an example of a module substrate and is a multilayer substrate. The resin member 81 may be a low temperature co-fired ceramic (LTCC) multilayer substrate composed of a plurality of dielectric layers.

The resin member 82 is disposed on a main surface of the resin member 81, covers the semiconductor IC 70 and the filters 41 to 43 mounted on the main surface and the main surface of the resin member 81, and has a function of securing reliability in terms of mechanical strength, moisture resistance, and so forth for the semiconductor IC 70 and the filters 41 to 43. The resin member 82 may be omitted.

A plurality of electrodes are formed on a surface of the circuit section 71. The plurality of electrodes electrically and mechanically connect the circuit section 71 and the resin member 81 to each other. A ground electrode B12, out of the plurality of electrodes, is connected to the gate terminal G2 disposed in the circuit section 71. In addition, a ground electrode B13, out of the plurality of electrodes, is connected to the capacitor 13 disposed in the circuit section 71. The ground electrodes B12 and B13 are connected to a ground terminal 54 (external connection terminal) formed on a rear surface of the resin member 81 by via electrodes (columnar electrodes) formed in the resin member 81.

When efforts are made to reduce the size of the amplification circuit 1E, the area in which external connection terminals may be provided is also reduced, and therefore a parasitic inductance $L_{G1}$ generated between the ground electrodes B12 and B13 and the ground terminal 54 increases. This may cause the amplification circuit 1E to oscillate.

Regarding this issue, in the amplification circuit 1E according to this modification, a high-frequency feedback signal is attenuated by the switch 14 and the capacitor 13 even when a parasitic inductance component is generated at the gate terminal G2 and the stable amplification circuit 1E in which oscillation is prevented can be provided.

The amplification circuit 1E does not have to include the resin member 81. In this case, the ground electrodes B12 and B13 serve as the ground terminal 54, and the parasitic inductance $L_{G1}$ generated at the gate terminal G2 is an inductance of the ground electrodes B12 and B13. The ground electrodes B12 and B13 may be bump electrodes bonded to a main surface of the semiconductor IC 70. Bump electrodes are, for example, columnar electrodes mainly composed of copper (Cu) or solder bumps. When efforts are made to reduce the size of the semiconductor IC 70, the area in which ground electrodes may be provided is also reduced, and therefore the parasitic inductance $L_{G1}$ of the ground electrodes B12 and B13 increases. This may cause the amplification circuit 1E to oscillate.

Regarding this issue, in the amplification circuit 1E according to this modification, a high-frequency feedback signal is attenuated by the switch 14 and the capacitor 13 even when a parasitic inductance component is generated at the gate terminal G2 and the stable amplification circuit 1E in which oscillation is prevented can be provided.

Embodiment 2

The amplification circuit according to Embodiment 1 has a configuration in which the gate terminal of the cascode-connected transistor 10 is grounded, whereas in this embodiment, an amplification circuit will be described that has a configuration in which the gate terminal of the cascode-connected transistor 10 is fixed at the power supply voltage.

2.1 Configuration of Amplification Circuit

Figure 15:
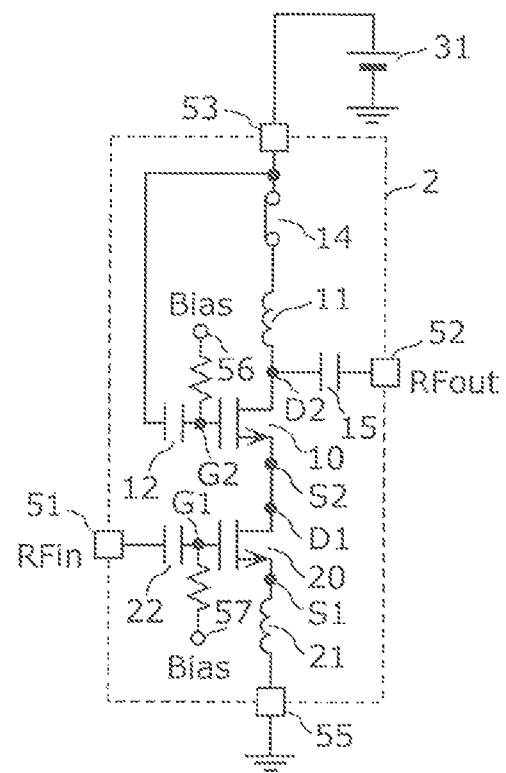
FIG. 15 is a circuit configuration diagram of an amplification circuit according to Embodiment 2 and circuits peripheral thereto.

FIG. 15 is a circuit configuration diagram of an amplification circuit 2 according to Embodiment 2 and circuits peripheral to the amplification circuit. As illustrated in the figure, the amplification circuit 2 includes the input terminal 51, the output terminal 52, the power supply terminal 53, the ground terminal 55, the transistors 10 and 20, the inductors 11 and 21, the capacitor 15, and the switch 14. The configuration of the amplification circuit 2 according to this embodiment differs from the configuration of the amplification circuit 1 according to Embodiment 1 in that there is no ground terminal 54 and in that the gate terminal G2 is fixed (in a high-frequency manner) at the power supply voltage. Hereafter, the description of the amplification circuit 2 according to Embodiment 2 will focus on points that are different from the amplification circuit 1 according to Embodiment 1 and description of points that are the same will be omitted.

The power supply terminal 53 is connected to the power supply 31 that generates a direct-current power supply voltage. In addition, the ground terminal 55 is grounded. A high-frequency signal (RFin) is input to the input terminal 51 and a high-frequency signal (RFout) amplified by the transistors 10 and 20 is output from output terminal 52.

In the amplification circuit 2 according to this embodiment, the drain terminal D1 is connected to the source terminal S2, the source terminal S1 is connected to the ground terminal 55 via the inductor 21, and the gate terminal G1 is connected to the input terminal 51 via the capacitor 22. In addition, the drain terminal D2 is connected to the output terminal 52 via the capacitor 15, and the gate terminal G2 is connected to the power supply terminal 53 via a capacitor 12. In other words, the transistor 10 is cascode connected to the transistor 20, and the amplification circuit 2 forms a cascode-connection amplification circuit.

The switch 14 is a switch element that is serially disposed on the first path that connects the drain terminal D2 and the power supply terminal 53 to each other and is a so-called first resistive element that functions as a resistance element having an on resistance when in a conductive state.

In other words, according to the above connection configuration, the drain terminal D2 and the gate terminal G2 are connected to each other via the inductor 11, the switch 14, and the power supply terminal 53.

In the above-described configuration of the amplification circuit 2 according to this embodiment, the gate terminal G2 of the transistor 10 is connected (in a high-frequency manner via the capacitor 12) to a direct-current power supply voltage. At this time, a parasitic inductance component, which is for example caused by a wiring line used to connect the power supply terminal 53 and the power supply 31, is generated at the gate terminal G2.

Therefore, the stability of the transistor is reduced due to the potential of the gate terminal G2 not being fixed (with respect to high frequencies), feedback occurs, and oscillation undesirably occurs when the loop gain is greater than or equal to 1.

Regarding this issue, in the above-described configuration of the amplification circuit 2 according to this embodiment, the drain terminal D2 connected to the output terminal 52 and the gate terminal G2 are (high-frequency) connected to each other via the switch 14. Therefore, when the switch 14 is in a conductive state, the drain terminal D2, the inductor 11, the switch 14, and the gate terminal G2 form a high-frequency signal feedback circuit between the drain terminal D2 and the gate terminal G2. Here, the switch 14 has an on resistance when in a conductive state, and therefore the feedback circuit forms a loop that does not have a loop gain that is greater than or equal to 1 (feedback signal is attenuated) due to the on resistance. In addition, the gate terminal G2 is not grounded (via the capacitor 12) and a resistive element such as the switch 14 is not disposed on the second path, and therefore the potential of the gate terminal G2 is stably set to a power supply potential. Thus, even when a parasitic inductance component is generated at the gate terminal G2, a high-frequency feedback signal between the drain terminal D2 and the gate terminal G2 is attenuated by this loop, and therefore a stable amplification circuit 2 in which oscillation is prevented can be provided.

In the case where the amplification circuit 2 is not performing an amplification operation, the switch 14 is in a non-conductive state, and therefore a so-called off leakage current that flows from the power supply terminal 53 to the ground terminal 55 via the drain terminal D2, the source terminal S2, the drain terminal D1, and the source terminal S1 can be suppressed.

In addition, the switch 14 may be a first resistance element (first resistive element) rather than a switch element that switches between a conductive state and a non-conductive state. In this case as well, the drain terminal D2, the inductor 11, the first resistance element, and the gate terminal G2 form a high-frequency signal feedback circuit between the drain terminal D2 and the gate terminal G2, and form a loop that does not have a loop gain greater than or equal to 1 due to the first resistance element (feedback signal is attenuated). Thus, even when a parasitic inductance component is generated at the gate terminal G2, a high-frequency feedback signal between the drain terminal D2 and the gate terminal G2 is attenuated by this loop, and therefore a stable amplification circuit 2 in which oscillation is prevented can be provided.

In addition, it is preferable that the first resistive element (switch 14 or first resistance element) be serially disposed on the first path between the inductor 11 and the gate terminal G2.

The inductor 11 is a matching element that is for realizing impedance matching between the transistors 10 and 20 and an externally connected circuit, and therefore the inductor 11 is disposed outside the region in which the transistors 10 and

20 are formed. Thus, the resistive element is disposed in a region outside the transistors 10 and 20 and a matching network formed of the inductor 11 and the capacitor 15, and therefore does not affect the gain of an amplifier formed by the transistors 10 and 20.

Figure 16A:
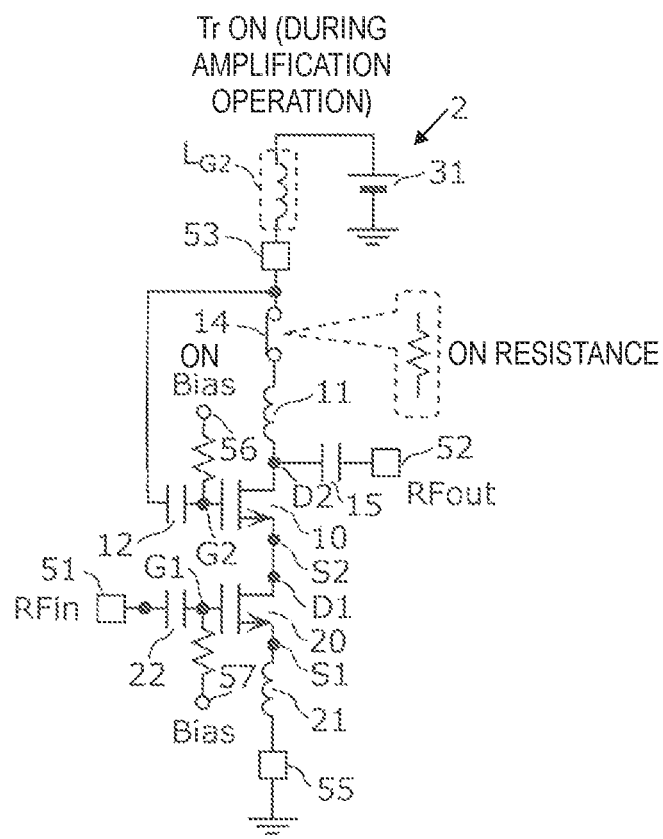
FIG. 16A is a diagram illustrating a circuit state when the amplification circuit according to Embodiment 2 is operating.
Figure 16B:
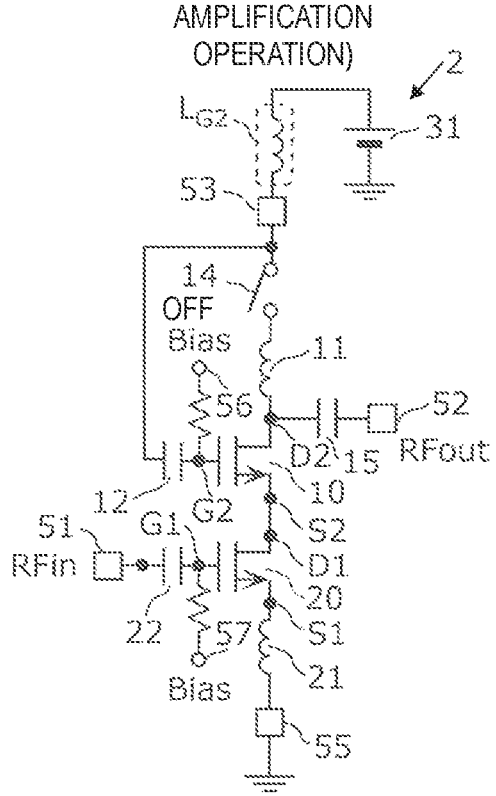
FIG. 16B is a diagram illustrating a circuit state when the amplification circuit according to Embodiment 2 is not operating.

FIG. 16A is a diagram illustrating a circuit state when the amplification circuit 2 according to Embodiment 2 is operating. FIG. 16B is a diagram illustrating a circuit state when the amplification circuit 2 according to Embodiment 2 is not operating. As illustrated in FIGS. 16A and 16B, the switch 14 is serially disposed on the first path that connects the drain terminal D2 and the power supply terminal 53 to each other. In addition, due to a wiring line or the like used to connect the power supply terminal 53 to the power supply 31, a parasitic inductance LG2 is generated at the gate terminal G2 with the power supply terminal 53 and the capacitor 12 interposed between the parasitic inductance LG2 and the gate terminal G2.

With respect to this, as illustrated in FIG. 16A, when a high-frequency signal (RFin) is input and the amplification circuit 2 performs an amplification operation, the switch 14 is a conductive state. On the other hand, as illustrated in FIG. 16B, when the amplification circuit 2 is not performing an amplification operation, the switch 14 is in a non-conductive state.

When an amplification operation is performed, the switch 14 has an on resistance when in a conductive state, and therefore the feedback circuit forms a loop that does not have a loop gain that is greater than or equal to 1 (feedback signal is attenuated) due to the on resistance. Thus, even when the parasitic inductance component LG2 is generated at the gate terminal G2, a feedback signal between the drain terminal D2 and the gate terminal G2 is attenuated by this loop, and therefore the stable amplification circuit 2 in which oscillation is prevented can be provided.

On the other hand, when an amplification operation is not being performed, the switch 14 is in a non-conductive state and a so-called off leakage current that flows from the power supply terminal 53 to the ground terminal 55 via the drain terminal D2, the source terminal S2, the drain terminal D1, and the source terminal S1 can be suppressed In other words, in the amplification circuit 2 in which the switch 14 is serially disposed on the first path, oscillation of the amplification circuit 2 can be suppressed when the amplification circuit 2 is performing an amplification operation and the off leakage current of the amplification circuit 2 can be suppressed when the amplification circuit 2 is not performing an amplification operation.

As the frequency becomes higher, the impedance ($j\omega LG2$) of the parasitic inductance LG2 increases and feedback via the gate becomes more likely to occur. In general, in the case where a high-performance transistor having a gain of up to several tens of GHz is used, there is a possibility that the loop gain of a loop formed by this feedback will be greater than or equal to 1. In addition, the off leakage current tends to increase, the higher the performance of the transistor that is used.

With respect to this, the amplification circuit 2 according to this embodiment is characterized in that, even when the high-frequency amplification performances of the transistors 10 and 20 are high, a feedback circuit in which a feedback signal is attenuated can be formed and the off leakage current can be suppressed.

The amplification circuit 2 according to this embodiment may include a second resistive element, which is a second resistance element or a second switch element, that is serially disposed on only the second path out of the first path and the second path. Thus, even in the case where the necessary resistance value is not secured with only the on resistance of a first switch element when the first switch element is in a conductive state, sufficient loop attenuation can be realized using a second resistive element while fixing the potential of the gate terminal G2.

2.2 Stability Factor of Amplification Circuit

Figure 17:
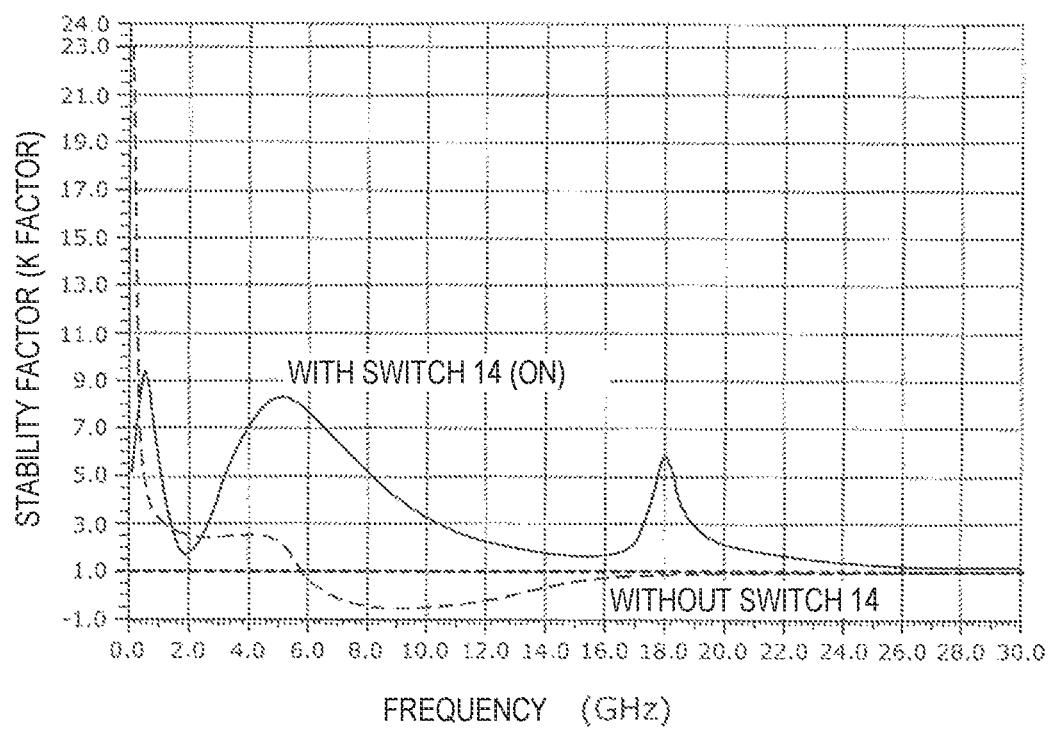
FIG. 17 is a graph illustrating a stability factor of the amplification circuit according to Embodiment 2.

FIG. 17 is a graph illustrating the stability factor of the amplification circuit 2 according to Embodiment 2. In the figure, the frequency characteristics of the stability factors (K factors) of the amplification circuit 2 according to Embodiment 2 (with switch 14 (on)) and an amplification circuit according to a comparative example (without switch 14) are illustrated. The configuration of the amplification circuit according to the comparative example differs from the configuration of the amplification circuit 2 according to Embodiment 2 only in that the switch 14 is not disposed.

As illustrated in the figure, in the amplification circuit according to the comparative example, when the parasitic inductance LG2 is generated at the gate terminal G2, there is a frequency band in which the stability factor (K factor) is smaller than 1 in a high-frequency band (~30 GHz) when an amplification operation is being performed, and therefore there is a high probability that an oscillation will undesirably occur in the high-frequency band.

In contrast, in the amplification circuit 2 according to this embodiment, even when the parasitic inductance LG2 is generated at the gate terminal G2, the stability factor (K factor) in a high-frequency band (~30 GHz) can be made to be greater than or equal to 1 when an amplification operation is being performed, and therefore a stable amplification operation in which oscillation is prevented can be provided.

OTHER EMBODIMENTS ETC

Amplification circuits according to embodiments of the present disclosure have been described above in the form of Embodiments 1 and 2, but an amplification circuit of the present disclosure is not limited to the above-described embodiments. Other embodiments realized by combining any of the constituent elements of the above-described embodiments, modifications obtained by modifying the above-described embodiments in various ways, as thought of by one skilled in the art, while not departing from the gist of the present disclosure, and various devices that have an amplification circuit of the present disclosure built thereinto are included in the scope of the present disclosure.

For example, an amplification circuit obtained by adding the resistance element 17 (second resistance element serially disposed on first path) according to Modification 2 of Embodiment 1 or the resistance element 18 (third resistance element connected in parallel with inductor 11) according to Modification 3 of Embodiment 1 to the amplification circuit 2 according to Embodiment 2 is also included in the scope of the present disclosure.

In addition, in the amplification circuits according to the embodiments described above, other high-frequency circuit elements, wiring lines, and so forth may be inserted partway along paths that connect circuit elements and signal paths disclosed in the drawings.

The present disclosure can be widely used in communication devices as a cascode-connection-type amplification circuit that amplifies a high-frequency signal.

What is claimed is:

1. An amplification circuit comprising:
  a first input terminal to which a high-frequency signal is input;

an output terminal that outputs an amplified high-frequency signal;
a power supply terminal that is connected to a power supply being configured to generate a direct-current power supply voltage;
a first transistor that has a first terminal, a second terminal, and a first control terminal, wherein a high-frequency signal is input to the first control terminal via the first input terminal;
a second transistor that has a third terminal connected to the second terminal, a fourth terminal configured to output the amplified high-frequency signal, and a second control terminal that is grounded, the second transistor being cascode-connected to the first transistor;
a first capacitance element that is serially connected in a second path, the second path connecting the second control terminal and the power supply terminal;
a first resistive element that is serially connected in a first path or is serially connected in the second path, the first path connecting the fourth terminal and the power supply terminal;
a first inductance element that is serially connected in the first path; and
a second capacitance element that is serially connected between the fourth terminal and the output terminal,
wherein the first resistive element is a first switch,
wherein the fourth terminal and the second control terminal are connected to each other via the first resistive element and the first capacitance element, and
wherein the first resistive element is serially connected in the first path between the first inductance element and the second control terminal.

2. The amplification circuit according to claim 1,
wherein when the amplification circuit is performing an amplification operation, the first switch is in a conductive state, and
when the amplification circuit is not performing an amplification operation, the first switch is in a non-conductive state.

3. The amplification circuit according to claim 1, further comprising:
a second resistive element that is serially connected in the first path or the second path, and is a second resistance element or a second switch.

4. The amplification circuit according to claim 1, further comprising:
a third resistance element that is connected in parallel with the first inductance element.

5. The amplification circuit according to claim 4, further comprising:
a third capacitance element; and
a first series circuit in which a fourth capacitance element and a third switch are connected in series with each other,
wherein the third capacitance element and the first series circuit are each connected in parallel with the first inductance element.

6. The amplification circuit according to claim 1, further comprising:
a second series circuit in which a fifth capacitance element and a fourth switch are connected in series with each other,
wherein the second series circuit is connected in parallel with the second capacitance element.

7. The amplification circuit according to claim 1, further comprising:

a plurality of filters that are connected between the first input terminal and the first control terminal, and have different pass bands;
a first switch circuit that is connected between the first input terminal and the plurality of filters, the first switch circuit being configured to selectively switch a connection between the first input terminal and any of the plurality of filters; and
a second switch circuit that is connected between the plurality of filters and the first control terminal, and that is configured to selectively switch a connection between the first control terminal and any of the plurality of filters.

8. The amplification circuit according to claim 1, further comprising:
a ground terminal to which the second control terminal is connected; and
an integrated circuit (IC) substrate on or in which the ground terminal, the first transistor, the second transistor, the first capacitance element, and the first resistive element are disposed,
wherein the ground terminal is a bump electrode bonded to a main surface of the IC substrate.

9. The amplification circuit according to claim 1, further comprising:
an external connection terminal to which the second control terminal is connected;
an IC substrate on or in which the first transistor, the second transistor, the first capacitance element, and the first resistive element are disposed; and
a module substrate having a first main surface and a second main surface, which face each other, the IC substrate being disposed on the first main surface,
wherein the external connection terminal is disposed on the second main surface of the module substrate.

10. The amplification circuit according to claim 1, further comprising:
a second input terminal;
a third transistor that has a fifth terminal, a sixth terminal, and a third control terminal, a high-frequency signal being input to the third control terminal via the second input terminal;
a fourth transistor that has a seventh terminal that is connected to the fifth terminal, an eighth terminal that outputs an amplified high-frequency signal, and a fourth control terminal that is grounded, the fourth transistor being cascode-connected to the third transistor; and
a third switch serially connected between the first inductance element and the eighth terminal,
wherein the first path connects the fourth terminal and the power supply terminal to each other, and connects the eighth terminal and the power supply terminal to each other, and
wherein the second path connects the second control terminal and the power supply terminal to each other, and connects the fourth control terminal and the power supply terminal to each other.

11. An amplification circuit comprising:
an input terminal to which a high-frequency signal is input;
an output terminal that outputs an amplified high-frequency signal;
a power supply terminal that is connected to a power supply, the power supply being configured to generate a direct-current power supply voltage;

a first transistor that has a first terminal, a second terminal, and a first control terminal to which a high-frequency signal is input;

a second transistor that has a third terminal that is connected to the second terminal, a fourth terminal that outputs an amplified high-frequency signal, and a second control terminal, the second transistor being cascode-connected to the first transistor;

a first resistive element that is serially connected in a first path, the first path connecting the fourth terminal and the power supply terminal;

a first inductance element that is serially connected in the first path; and a second capacitance element that is serially connected between the fourth terminal and the output terminal, wherein the first resistive element is a first switch, wherein the fourth terminal and the second control terminal are connected to each other via the first resistive element, and wherein the first resistive element is serially connected in the first path between the first inductance element and the second control terminal.

12. The amplification circuit according to claim 11,
wherein the first resistive element is serially connected in the first path between the first inductance element and the power supply terminal.

13. The amplification circuit according to claim 11,
wherein when the amplification circuit is performing an amplification operation, the first switch is in a conductive state, and
when the amplification circuit is not performing an amplification operation, the first switch is in a non-conductive state.

14. The amplification circuit according to claim 11, further comprising:
a second resistive element that is serially connected in a second path, and is not serially connected in the first path,
wherein the second path connects the second control terminal and the power supply terminal to each other, and
wherein the second resistive element is a second resistance element or a second switch.

15. The amplification circuit according to claim 12, further comprising:
a third resistance element that is connected in parallel with the first inductance element.

* * * * *